United States Patent
Takahashi et al.

(10) Patent No.: US 9,818,630 B2
(45) Date of Patent: Nov. 14, 2017

(54) SUBSTRATE PROCESSING APPARATUS

(71) Applicant: HITACHI KOKUSAI ELECTRIC INC., Tokyo (JP)

(72) Inventors: Akira Takahashi, Toyama (JP); Kazuyuki Toyoda, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 15/070,640

(22) Filed: Mar. 15, 2016

(65) Prior Publication Data

US 2017/0221738 A1 Aug. 3, 2017

(30) Foreign Application Priority Data

Jan. 29, 2016 (JP) .................................. 2016-015561

(51) Int. Cl.
*H01L 21/67* (2006.01)

(52) U.S. Cl.
CPC .. *H01L 21/67248* (2013.01); *H01L 21/67098* (2013.01)

(58) Field of Classification Search
None
See application file for complete search history.

(56) References Cited

U.S. PATENT DOCUMENTS

| | | | |
|---|---|---|---|
| 5,279,671 A * | 1/1994 | Hosokawa | C23C 16/46 118/724 |
| 5,855,681 A * | 1/1999 | Maydan | H01L 21/67167 118/719 |
| 6,152,070 A | 11/2000 | Fairbairn et al. | |
| 6,302,966 B1 * | 10/2001 | Bailey, III | H01J 37/32522 118/712 |
| 8,061,949 B2 * | 11/2011 | Kurita | C23C 14/566 414/217 |

(Continued)

FOREIGN PATENT DOCUMENTS

| JP | 08-500938 A | 1/1996 |
|---|---|---|
| JP | 2004-153166 A | 5/2004 |

(Continued)

OTHER PUBLICATIONS

Japanese Patent Office Action, JP Patent Application No. 2016-015561, Jul. 20, 2017, 3 pages.

*Primary Examiner* — Karla Moore
(74) *Attorney, Agent, or Firm* — Volpe and Koenig, P.C.

(57) ABSTRACT

A substrate processing apparatus includes a first reaction chamber including: a first heating unit, a first processing space, and a first transfer space disposed under the first processing space, a second reaction chamber including: a second heating unit, a second processing space, and a second transfer space disposed under the second processing space; a first sidewall and a second sidewall defining the first reaction chamber and the second reaction chamber, wherein the first sidewall is shared by the first reaction chamber and the second reaction chamber, and a cooling channel disposed in the first sidewall and the second sidewall such that a cooling efficiency of the first sidewall is higher than that of the second sidewall, wherein the first reaction chamber and the second reaction chamber are disposed adjacent to each other with the first sidewall therebetween.

6 Claims, 14 Drawing Sheets

(56) References Cited

U.S. PATENT DOCUMENTS

| | | | |
|---|---|---|---|
| 2007/0272155 A1* | 11/2007 | Nozawa | ............... C23C 16/463 118/725 |
| 2008/0271471 A1 | 11/2008 | Nozawa et al. | |
| 2012/0034570 A1 | 2/2012 | Yasui et al. | |
| 2012/0305196 A1 | 12/2012 | Mori et al. | |
| 2012/0325148 A1 | 12/2012 | Yamagishi et al. | |
| 2012/0328780 A1 | 12/2012 | Yamagishi | |

FOREIGN PATENT DOCUMENTS

| | | |
|---|---|---|
| JP | 2005-210080 A | 8/2005 |
| JP | 2007-088337 A | 4/2007 |
| JP | 2012-054536 A | 3/2012 |
| JP | 2012-216715 A | 11/2012 |
| KR | 10-1998-0042483 A | 8/1998 |
| KR | 10-1998-0085020 A | 12/1998 |
| KR | 10-2014-0052611 A | 5/2014 |
| WO | 93/17448 A1 | 9/1993 |

\* cited by examiner

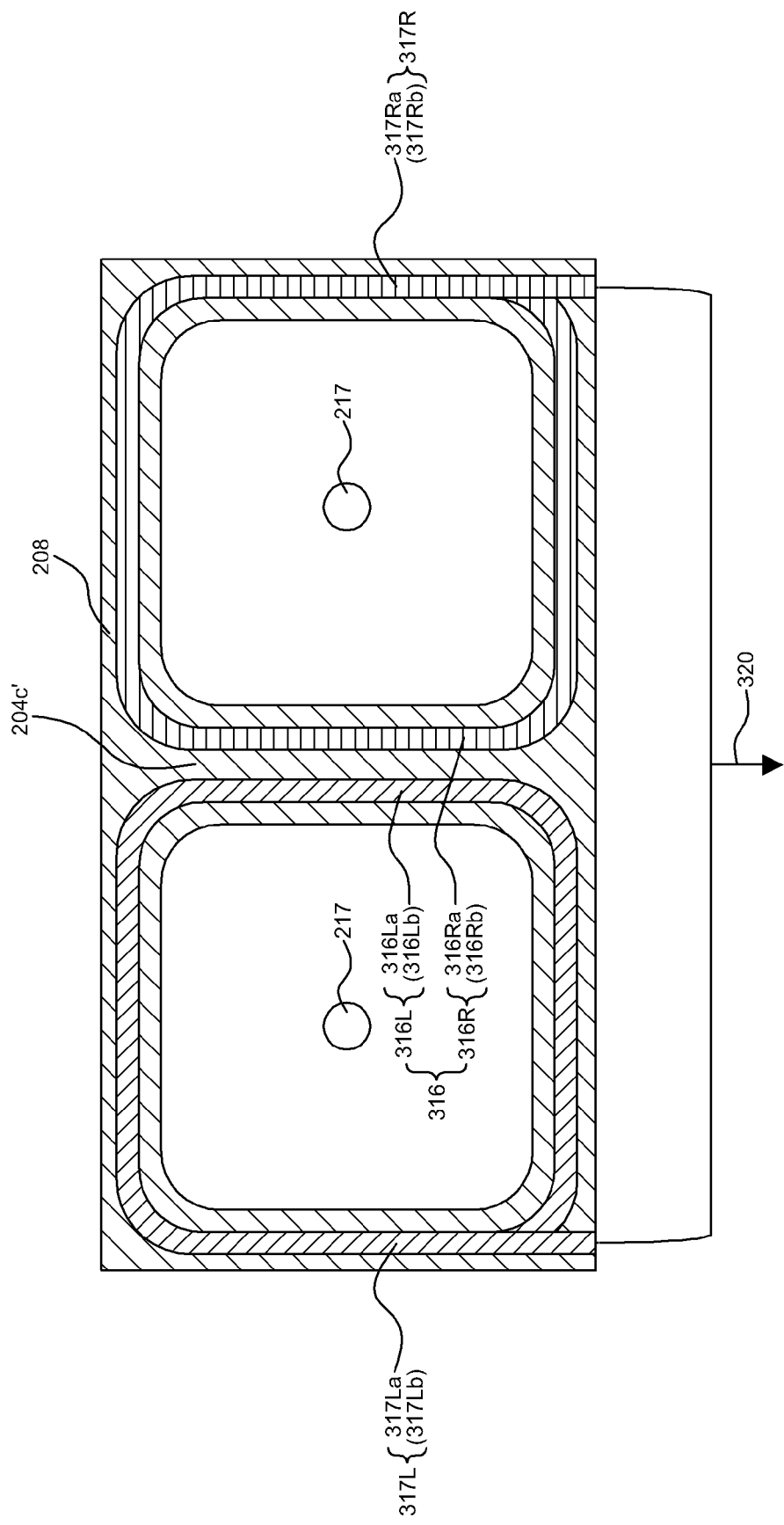

SUBSTRATE PROCESSING APPARATUS

CROSS-REFERENCE TO RELATED PATENT APPLICATION

This U.S. non-provisional patent application claims priority under 35 U.S.C. §119 of Japanese Patent Application No. 2016-015561, filed on Jan. 29, 2016, in the Japanese Patent Office, the entire contents of which are hereby incorporated by reference.

BACKGROUND OF THE INVENTION

1. Field of the Invention

The present invention relates to a substrate processing apparatus.

2. Description of the Related Art

A substrate processing apparatus used in a semiconductor device manufacturing process includes a substrate processing apparatus provided with a plurality of process modules including reaction chambers (for example, Patent Literature 1).

RELATED ART LITERATURE

Patent Literature

1. Japanese Unexamined Patent Application, First Publication No. 2012-54536

SUMMARY OF THE INVENTION

In order to improve the quality of a film formed on a substrate in a substrate processing apparatus including a plurality of process modules, a method of processing a substrate at a high temperature may be used. When the substrate is processed at a high temperature, a reaction chamber of the substrate processing apparatus including the plurality of process nodules in which the substrate is placed is maintained at a high temperature.

However, when the reaction chamber is maintained at a high temperature upon operation of the apparatus, a peripheral structure of the reaction chamber is adversely affected since the peripheral structure of the reaction chamber is heated.

The present invention is directed to suppressing a thermal effect of a peripheral structure of a reaction chamber even when a substrate is processed while maintaining the reaction chamber at a high temperature.

According to an aspect of the present invention, there is provided a substrate processing apparatus including a first reaction chamber including: a first heating unit configured to heat a first substrate, a first processing space where the first substrate is processed, and a first transfer space disposed under the first processing space, a second reaction chamber including: a second heating unit configured to heat a second substrate, a second processing space where the second substrate is processed, and a second transfer space disposed under the second processing space; a first sidewall and a second sidewall defining the first reaction chamber and the second reaction chamber, wherein the first sidewall is shared by the first reaction chamber and the second reaction chamber, and a cooling channel disposed in the first sidewall and the second sidewall such that a cooling efficiency of the first sidewall is higher than that of the second sidewall, wherein the first reaction chamber and the second reaction chamber are disposed adjacent to each other with the first sidewall therebetween.

BRIEF DESCRIPTION OF THE DRAWINGS

FIGS. 4A through 4C are diagrams illustrating pipes of the substrate processing apparatus according to the first embodiment of the present invention.

DETAILED DESCRIPTION OF THE PREFERRED EMBODIMENTS

Hereinafter, embodiments of the present invention will be described with reference to the accompanying drawings.

First Embodiment According to the Invention

First, a first embodiment according to the present invention will be described.

(1) Configuration of Substrate Processing Apparatus

Figure 1:
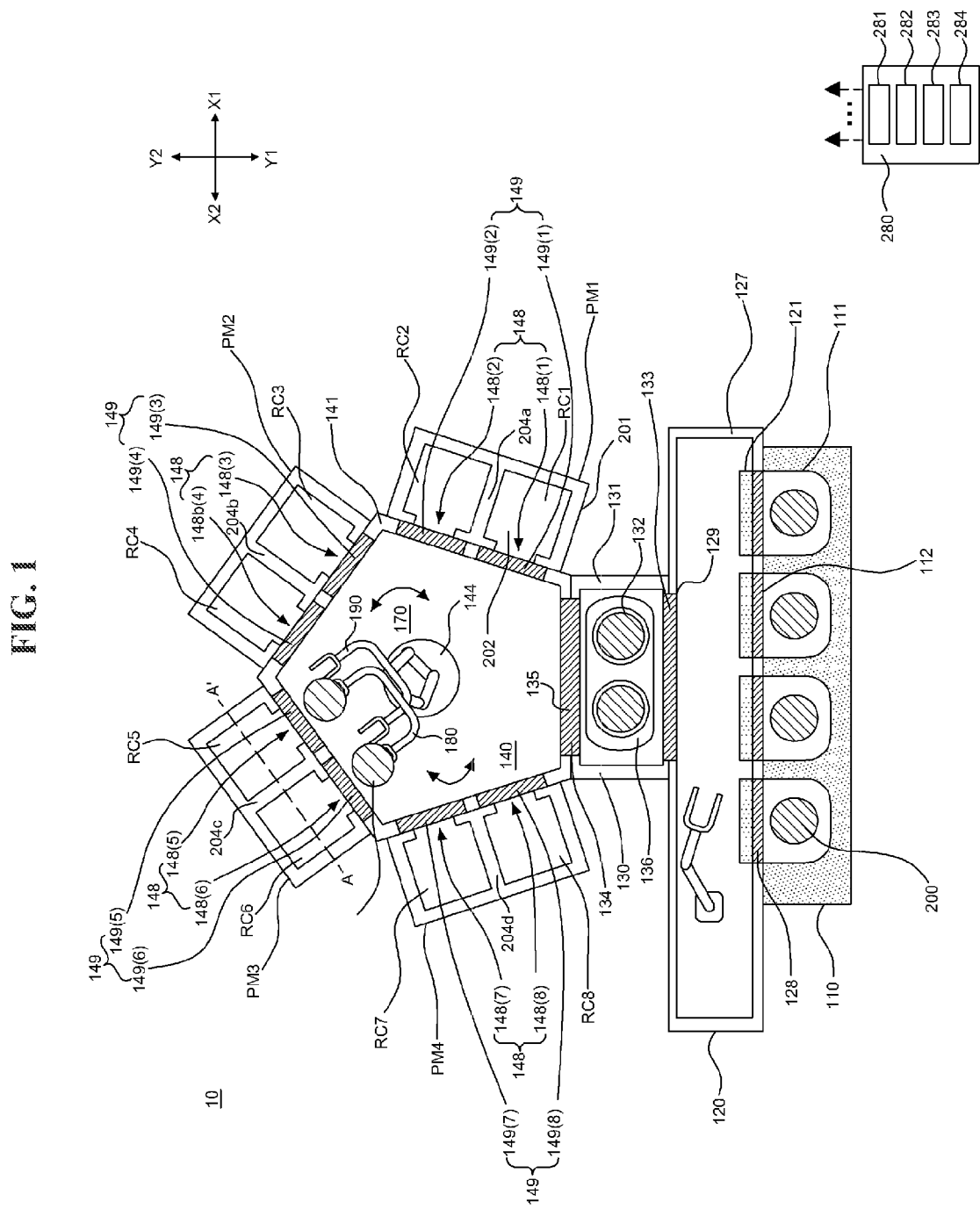
FIG. 1 is a diagram schematically illustrating a substrate processing apparatus according to a first embodiment of the present invention.
Figure 2:
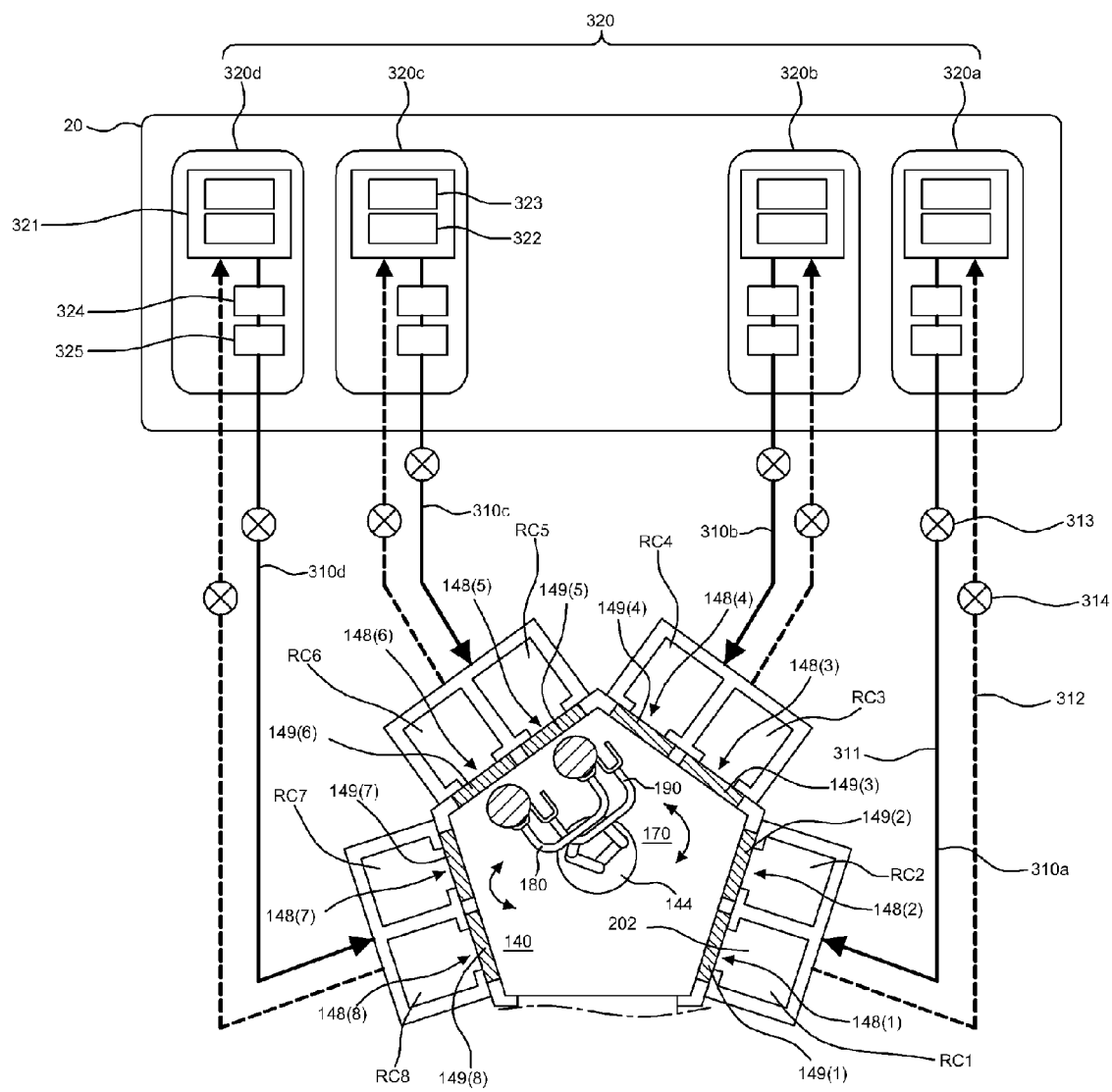
FIG. 2 is a diagram illustrating a relation between a main body section and a temperature adjustment system of the substrate processing apparatus according to the first embodiment of the sent invention.

FIGS. 1 and 2 are views schematically showing a substrate processing apparatus according to the first embodiment. The substrate processing apparatus shown in FIGS. 1 and 2 includes a main body section 10, a temperature adjustment system 20 and a controller 280.

<Configuration of Main Body Section>

The main body section 10 of a cluster type substrate processing apparatus includes a plurality of reaction chambers installed around a substrate transfer chamber. The main body section 10 of the substrate processing apparatus includes an IO stage 110, an atmospheric transfer chamber 120, a load lock chamber 130, a vacuum transfer chamber 140 and process modules PM1, PM2, PM3 and PM4, that are configured to process a wafer 200 serving as a substrate. Hereinafter, these components will be described in detail. In FIG. 1, an X1 direction represents a right side, an X2 direction represents a left side, a Y1 direction represents a front side and a Y2 direction represents a rear side.

(Atmospheric Transfer Chamber and IO Stage)

The IO stage 110 (a loading port) is installed immediately in front of the substrate processing apparatus. A plurality of front opening unified pods (FOUPs) 111 (hereinafter, referred to as "pods") configured to receive a plurality of wafers are placed on the IO stage 110. Each of the pods 111 is used as a carrier configured to convey the wafer 200 such as a silicon (Si) substrate, and an unprocessed wafer 200 or a processed wafer 200 is horizontally stored in the pod 111.

The IO stage 110 is disposed adjacent to the atmospheric transfer chamber 120. The load lock chamber 130 (to be described below) is connected to a side of the atmospheric transfer chamber 120 different from a side thereof to which the IO stage 110 is connected.

An atmospheric conveyance robot 122 configured to transfer the wafer 200 installed in the atmospheric transfer chamber 120. The atmospheric conveyance robot 122 is elevated by an elevator (not shown) installed at the atmospheric transfer chamber 120 and moved in leftward and rightward directions by a linear actuator (not shown).

A substrate loading/unloading port 128 configured to load the wafer 200 into or unloading the wafer 200 from the atmospheric transfer chamber 120, and a pod opener 121 are installed at a front side of a housing 127 of the atmospheric transfer chamber 120. The IO stage 110 (a loading port) is installed at an opposite side of the pod opener 121, i.e., outside the housing 127 via the substrate loading/unloading port 128.

The pod opener 121 can open or close a cap 112 of the pod 111 placed on the IO stage 110 to open or close a substrate entrance, and the wafer 200 can be loaded into the pod 111 or unloaded from the pod 111 through the substrate entrance.

A substrate loading/unloading port 129 configured to load the wafer 200 into the load lock chamber 130 or unload the wafer 200 from the load lock chamber 130 is installed at a rear side of the housing 127 of the atmospheric transfer chamber 120. As the substrate loading, unloading port 129 is opened or closed by a gate valve 133 (to be described below), the wafer 200 can be loaded into the load lock chamber 130 or unloaded from the load lock chamber 130. The substrate loading/unloading port 129 configured to load the wafer 200 into the load lock chamber 130 or unload the wafer 200 from the load lock chamber 130 is installed at the rear side of the housing 127 of the atmospheric transfer chamber 120. The wafer 200 can be loaded into the load lock chamber 130 or unloaded from the load lock chamber 130 through the substrate loading/unloading port 129 by opening and closing the substrate loading/unloading port 129 using the gate valve 133.

(Load Lock Chamber)

The load lock chamber 130 is disposed adjacent to the atmospheric transfer chamber 120. As described below, the vacuum transfer chamber 140 is disposed at a side of a housing 131 different from a side thereof at which the atmospheric transfer chamber 120 is disposed among sides of a housing 131 that constitute the load lock chamber 130. Since an internal pressure of the housing 131 is varied according to a pressure of the atmospheric transfer chamber 120 and a pressure of the vacuum transfer chamber 140, the load lock chamber 130 has a structure that can endure a negative pressure.

A substrate loading/unloading port 134 is installed adjacent to the vacuum transfer chamber 140 in the housing 131. As the substrate loading/unloading port 134 is opened or closed by a gate valve 135, the wafer 200 can be loaded into the vacuum transfer chamber 140 or unloaded from the vacuum transfer chamber 140. The substrate loading/unloading port 134 is installed at a side of the housing 131 adjacent to the vacuum transfer chamber 140. The wafer 200 can be loaded into the vacuum transfer chamber 140 or unloaded from the vacuum transfer chamber 140 by opening and closing the substrate loading unloading port 134 using the gate valve 135.

In addition, a substrate placing table 132 including at least two placing surfaces on which wafers 200 are placed is installed in the load lock chamber 130. A distance between the substrate placing surfaces is set according to a distance between end effectors included in arms of a robot 170 (to be described below).

(Vacuum Transfer Chamber)

The main body section 10 of the substrate processing apparatus includes the vacuum transfer chamber 140 serving as a conveyance space into which the wafer 200 is conveyed under a negative pressure. A housing 141 that constitutes the vacuum transfer chamber 140 may have a pentagonal shape as seen in a birds-eye view, and the load lock chamber 130 and the process modules PM1 through PM4 configured to process the wafer 200 are connected to sides of the pentagonal shape, respectively. The robot 170 configured to convey the wafer 200 under a negative pressure is installed at substantially a center of the vacuum transfer chamber 140.

The substrate loading/unloading port 134 is installed at a sidewall of the housing 141 adjacent to the load lock chamber 130 among sidewalls of the housing 141. The wafer 200 can be loaded into the load lock chamber 130 or unloaded from the load lock chamber 130 through the substrate loading unloading port 134 by opening and closing the substrate loading/unloading port 134 using a gate valve 135.

A vacuum conveyance robot 170 installed in the vacuum transfer chamber 140 can be elevated by an elevator while maintaining airtightness of the vacuum transfer chamber 140. Two arms 180 and 190 included on the robot 170 can be elevated.

The plurality of process module, for example, the four process modules PM1 through PM4 are radially installed at sidewalls of the housing 141 at which the load lock chamber 130 is not installed among five sidewalls of the housing 141 about the vacuum transfer chamber 140. Each of the process modules PM1 through PM4 is capable of performing a predetermined process on the wafer. As will be described below, a predetermined process may include a process of forming a thin film on a wafer, a process of performing oxidation, nitridation, carbonization, or the like, on a wafer surface, a process of forming a film such as silicide and metal and etching a wafer surface, and various types of substrate processing such as reflow processing.

Reaction chambers RC1, RC2, RC3, RC4, RC5, RC6, RC7 and RC8 serving as chambers configured to process the wafer are installed at the process modules PM1 through PM4. For example, two reaction chambers may be installed in each of the process modules PM1 through PM4. Specifically, the reaction chambers RC1 and RC2, the reaction chambers RC3 and RC4, the reaction chambers RC5 and RC6 and the reaction chambers RC7 and RC8 may be installed at the process module PM1, the process module PM2, the process module PM3 and the process module PM4, respectively.

The reaction chambers RC1 through RC8 may have independent atmospheres as partition walls 204 (204a, 204b, 204c and 204d) are installed between the reaction chambers RC1 through RC8 installed at the process modules PM1 through PM4 such that atmospheres of a processing space 201 (to be described below) are not mixed. Specifically, the partition wall 204a, the partition wall 204b, the partition wall 204c and the partition wall 204d are installed between the reaction chambers RC1 and RC2, between the reaction chambers RC3 and RC4, between the reaction chambers RC5 and RC6 and between the reaction chambers RC7 and RC8, respectively.

The reaction chambers RC1 through RC8 will be described in detail.

A substrate loading/unloading port 148 is installed at sidewalls of the housing 141 opposite to each of the reaction chambers RC1 through RC8 among the sidewalls of the housing 141. Specifically, a substrate loading/unloading port 148(1), a substrate loading/unloading port 148(2), a substrate loading/unloading port 148(3), a substrate loading/unloading port 148(4), a substrate loading/unloading port 148(5), a substrate loading/unloading port 148(6), a substrate loading/unloading port 148(7) and a substrate loading/unloading port 148(8) are installed at the sidewall opposite to the reaction chamber RC1, the sidewall opposite to the reaction chamber RC2, the sidewall opposite to the reaction chamber RC3, the sidewall opposite to the reaction chamber RC4, the sidewall opposite to the reaction chamber RC5, the sidewall opposite to the reaction chamber RC6, the sidewall opposite to the reaction chamber RC7 and the sidewall opposite to the reaction chamber RC8, respectively.

The wafer 200 can be loaded into the reaction chambers RC1 through RC8 or unloaded from the reaction chambers RC1 through RC8 through the substrate loading/unloading port 148 by opening and closing the substrate loading/unloading port 148 using a gate valve 149. The gate valves 149 are installed at the reaction chambers RC1 through RC8, respectively. Specifically, a gate valve 149(1), a gate valve 149(2), a gate valve 149(3), a gate valve 149(4), a gate valve 149(5), a gate valve 149(6), a gate valve 149(7) and a gate valve 149(8) are installed between the reaction chamber RC1 and the vacuum transfer chamber 140, between the reaction chamber RC2 and the vacuum transfer chamber 140, between the reaction chamber RC3 and the vacuum transfer chamber 140, between the reaction chamber RC4 and the vacuum transfer chamber 140, between the reaction chamber RC5 and the vacuum transfer chamber 140, between the reaction chamber RC6 and the vacuum transfer chamber 140, between the reaction chamber RC7 and the vacuum transfer chamber 140 and between the reaction chamber RC8 and the vacuum transfer chamber 140, respectively.

When the wafer 200 is conveyed between the reaction chambers RC1 through RC8 and the vacuum transfer chamber 140, as the gate valve 149 is opened and the arms 180 and 190 of the vacuum conveyance robot 170 are inserted through the gate valve 149, the wafer 200 can be loaded or unloaded by the arms 180 and 190.

<Configuration of Temperature Adjustment System>

The temperature adjustment system 20 will be described with reference to FIG. 2. FIG. 2 is a diagram illustrating a relation of the main body section 10 of the substrate processing apparatus and the temperature adjustment system 20. FIG. 2 shows a portion of the main body section 10 and the temperature adjustment system 20 connected to a process module.

In order to maintain a processing condition of the process modules PM1 through PM4 within a predetermined range, the temperature adjustment system 20 adjusts temperatures of the process modules PM1 through PM4. Specifically, as a thermal medium flows and circulates penetrating pipes 310a through 310d serving as flow paths of the thermal medium connected to the process modules PM1 through PM4, the temperature adjustment system 20 can maintain the reaction chambers of the process modules PM1 through PM4 at a predetermined temperature.

The thermal medium flowing through the pipes 310a through 310d is a fluid used to move heat between the temperature adjustment system 20 and the process modules PM1 through PM4 to adjust the process modules PM1 through PM4 to a desired temperature by heating or cooling the medium. The thermal medium may include a fluorine-based thermal medium such as Gulden (trademark). The fluorine-based thermal medium, which is non-flammable, can be used within a wide temperature range from a low temperature to a high temperature and has good electrical insulation. However, the thermal medium may not necessarily include the fluorine-based thermal medium. For example, the thermal medium may be a liquid such as water or may be a gas such as an inert gas.

(Temperature Adjustment Unit)

A temperature adjustment unit 320 that constitutes the temperature adjustment system 20 supplies the thermal medium of adjusting temperatures of the process modules PM1 through PM4 into the pipes 310a through 310d and controls a state of the thermal medium supplied into the pipes 310a through 310d. Accordingly, temperature adjustment units 320a, 320b, 320c and 320d have the same configuration as described below, and the temperature adjustment units 320a through 320d are generally referred to as the temperature adjustment unit 320.

The temperature adjustment unit 320 includes a circulation tank 321 serving as a storage container of a thermal medium. Additionally, a heating unit 322 configured to heat the thermal medium and a cooling unit 323 configured to cool the thermal medium are installed at the circulation tank 321. The temperature adjustment unit 320 can adjust a temperature of the thermal medium using the heating unit 322 and the cooling unit 323. Since the heating unit 322 and the cooling unit 323 can be embodied using a known technology, detailed description of the heating unit 322 and the cooling unit 323 will be omitted.

An upstream pipe 311 serving as an upstream flow path section connected to an upstream side of the process modules PM1 through PM4 to supply the thermal medium to the process modules PM1 through PM4 and a downstream pipe 312 serving as a downstream flow path section connected to a downstream side of the process modules PM1 through PM4 to recover the thermal medium passing and circulating through the process modules PM1 through PM4 are connected to the circulation tank 321. That is, the pipes 310a through 310d connected to the process modules PM1 through PM4 include upstream pipes 311 (depicted as solid arrows in FIG. 2) and downstream pipes 312 (depicted as dotted arrows in FIG. 2).

In addition, a pump 324 configured to provide a driving force (a kinetic energy) to cause the thermal medium to flow through the pipe and a flow rate control unit 325 configured to adjust a flow rate of the thermal medium flowing through the pipe are installed at the upstream pipe 311. The temperature adjustment units 320a through 320d can control at least one of a pressure or a flow rate of the thermal medium using the pump 324 and the flow rate control unit 325. Since the pump 324 and the flow rate control unit 325 can be embodied using a known technology, detailed description of the pump 324 and the flow rate control unit 325 will be omitted.

The temperature adjustment units 320a through 320d are separated from the process modules PM1 through PM4 and collectively installed at one place. That is, the temperature adjustment system 20 including the temperature adjustment units 320a through 320d is collectively installed at a place separated from the main body section 10 of the substrate processing apparatus including the process modules PM1 through PM4, for example, another floor in a factory. This is because installation environments (a cleanliness in a clean room) required in the main body section 10 and the temperature adjustment system 20 of the substrate processing apparatus are different. In addition, this is because the thermal medium can be easily managed because the temperature adjustment units 320a through 320d are installed at one place in the temperature adjustment system 20.

(Pipe)

As described above, the pipes 310a through 310d configured to connect the process modules PM1 through PM4 and the temperature adjustment units 320a through 320d include the upstream pipe 311 connected to the upstream side of the process modules PM1 through PM4 and the downstream pipe 312 connected to the downstream side of the process modules PM1 through PM4. Pipes between the upstream pipe 311 and the downstream pipe 312 are installed at the process modules PM1 through PM4. The pipes installed at the process modules PM1 through PM4 will be described below.

Valves 313 and 314 configured to open or close a flow path of a thermal medium in the pipes are installed at the upstream pipe 311 and the downstream pipe 312, respectively. In addition, a sensor 3151 configured to detect a state of the thermal medium flowing through the pipes is installed at the upstream pipe 311 of the process modules PM1 through PM4. The sensor 3151 can detect at least one of a pressure, a flow rate and a temperature of the thermal medium. Since the sensor 3151 can be embodied using a known technology, detailed description of the sensor 3151 will be omitted.

(Controller)

The controller 280 controls operations of the main body section 10 and the temperature adjustment system 20 of the substrate processing apparatus. Accordingly, the controller 280 includes a calculation unit 281 constituted by combination of a central processing unit (CPU) and a random access memory (RAM), and a storage unit 282 constituted by a flash memory, a hard disk drive (MD), and so on. The calculation unit 281 of the controller 280 reads and executes various kinds of programs or recipes from the storage unit 282 according to an instruction of a high level controller or a user. The calculation unit 281 can control a processing operation of the main body section 10, the temperature adjustment system 20, or the like, according to contents of the read program.

The controller 280 may be constituted by a dedicated computer, and in addition may be embodied by a general-purpose computer. For example, the controller 280 according to the embodiment can be embodied by preparing an external storage device 283 in which the above-mentioned program or the like is stored (for example, a magnetic disk such as a magnetic tape, a flexible disk or a hard disk, an optical disk such as compact disc (CD) or digital versatile disc (DVD), a magneto-optical disk such as an MO, and a semiconductor memory such as a universal serial bus (USB) memory or a memory card) and installing the program or the like at a general-purpose computer using the external storage device 283. In addition, a means configured to provide the program to the computer is not limited to the external storage device 283. For example, the program or the like may be provided using a communication means such as the Internet or an exclusive line with no intervention of the external storage device 281 in addition, the storage unit 282 or the external storage device 283 may be embodied as a non-transitory computer-readable recording medium. Hereinafter, these are generally referred to as "a recording medium." In addition, when the term "recording medium" is used herein, the recording medium may include solely the storage unit 282, the external storage device 283, or both of these. In addition, the term "program" used herein may include solely a control program, an application program, or both of these.

A transceiver unit 284 is connected to each component or a high level apparatus of the main body section 10 and the temperature adjustment system 20 of the substrate processing apparatus via a network. The transceiver unit 284 is configured to receive information from each component or the high level apparatus of the main body section 10 and the temperature adjustment system 20 of the substrate processing apparatus, or transmit the received information to the controller 280.

(2) Configuration of Process Module

Hereinafter, configurations of the reaction chambers RC1 through RC8 of the process modules PM1 through PM4 will be described.

Each of the process modules PM1 through PM4 functions as a sheet-feed type substrate processing apparatus, and as described above, includes two reaction chambers. The two reaction chambers have the same configurations as the process modules PM1 through PM4.

Figure 3:
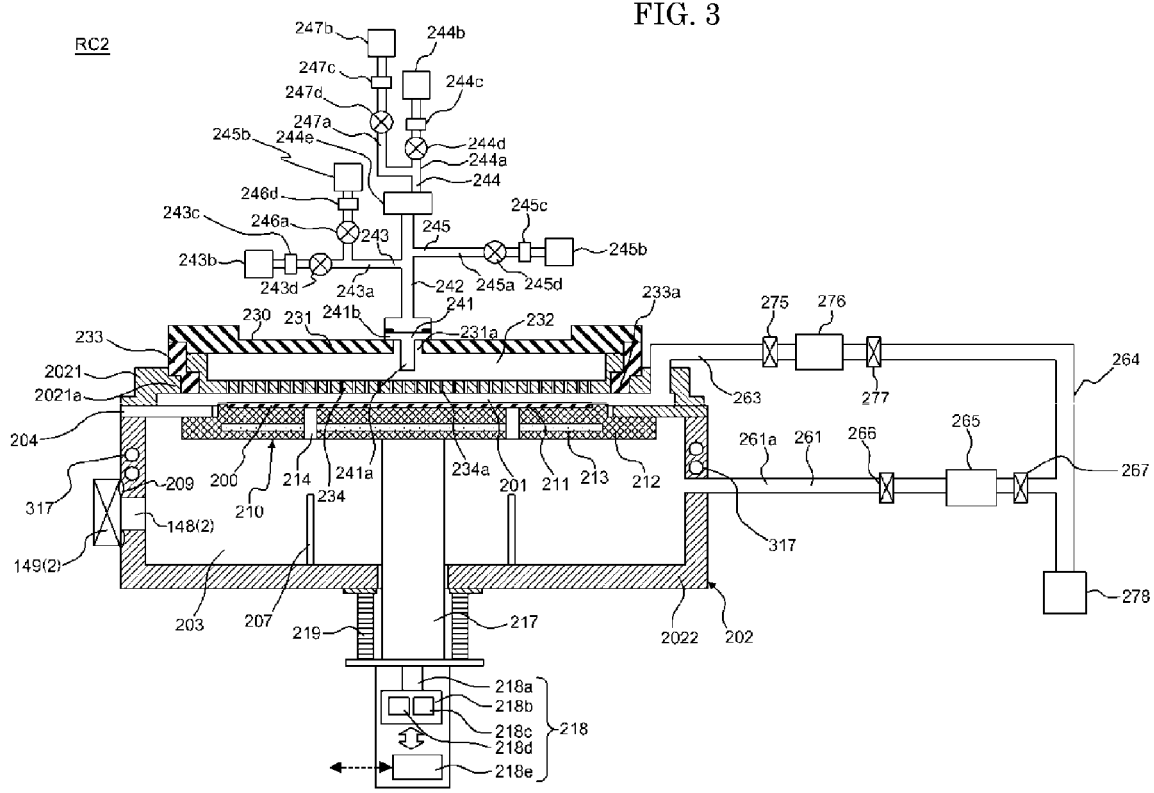
FIG. 3 is a diagram schematically illustrating an exemplary configuration of a reaction chamber of the substrate processing apparatus according to the first embodiment of the present invention.

In the specification, configurations of the reaction chambers RC1 through RC8 of the process modules PM1 through PM4 will be described in detail. FIG. 3 is a diagram schematically illustrating an exemplary configuration of the reaction chamber of the substrate processing apparatus according to the first embodiment, for example, the reaction chamber RC2.

(Processing Container)

As shown in FIG. 3, the reaction chamber RC2 includes a processing container 202. The processing container 202 is, for example, a sealed container having a circular and flat cross section. The processing container 202 is constituted by an upper container 2021 formed of a non-metal material such as quartz or a ceramic, and a lower container 2022 formed of a metal material such as aluminum (Al) or stainless steel (SUS). The processing space 201 (the reaction chamber) in which the wafer 200 such as a silicon wafer serving as a substrate is processed is formed at an upper section in the processing container 202 (an higher upper space than a substrate placing table 212 (to be described below)), and a conveyance space 203 is formed at a lower space of the processing space 201 surrounded by the lower container 2022.

A substrate loading/unloading port 206 (corresponding to the above-mentioned substrate loading/unloading port 148) adjacent to a gate valve 205 is installed at a side surface of the lower container 2022. The wafer 200 can be loaded into the conveyance space 203 through the substrate loading/unloading port 206. Lift pins 207 are installed at a bottom section of the lower container 2022.

A cooling channel 316 and a cooling channel 317 in communication with the pipe 310a (in the case of the reaction chambers RC4, RC6 and RC8 in communication with the pipes 310b, 310c and 310d, respectively) are installed at a side surface of the lower container 2022 that does not overlap the substrate loading/unloading port 206. As described below, the cooling channel 316 is installed at the partition wall 204a between neighboring transfer chambers 203. The cooling channel 317 is installed at an outer sidewall 208 of the transfer chamber 203.

The cooling channel 316 and the cooling channel 317 are flow paths through which the thermal medium is supplied. The cooling channel 316 and the cooling channel 317 configured to supply the thermal medium are installed to horizontally surround the conveyance space 203. A relation between the cooling channel 316, the cooling channel 317 and the processing container will be described below.

(Substrate Placing Table)

A substrate support unit 210 (a susceptor) configured to support the wafer 200 is installed in the processing space 201. The substrate support unit 210 includes the substrate placing table 212 including a placing surface 211 on which the wafer 200 is placed, and a heating unit 213 serving as a heat source included in the substrate placing table 212. The through-holes 214 through which the lift pins 207 pass are formed at positions corresponding to the lift pins 207 of the substrate placing table 212.

The substrate placing table 212 is supported by a shaft 217. The shaft 217 passes through a bottom section of the processing container 202 to be connected to an elevation unit 218 outside the processing container 202.

The elevation unit 218 includes a support shaft 218a configured to support the shaft 217, and an actuation unit 218b configured to elevate or rotate the support shaft 218a. The actuation unit 218b includes an elevation mechanism 218c including a motor for elevation, and a rotary mechanism 218d such as a gear configured to rotate the support shaft 218a. A material such as grease is applied to the elevation mechanism 218c and the rotary mechanism 218d to smooth operations of the elevation mechanism 218c and the rotary mechanism 218d.

The elevation unit 218 may include an instruction unit 218e configured to instruct an elevation and a rotation to the actuation unit 218b. The instruction unit 218e is electrically connected to the controller 280. The instruction unit 218e controls an actuation unit 171b based on the instruction of the controller 280.

As the elevation unit 218 is operated to elevate the shaft 217 and the substrate placing table 212, the substrate placing table 212 can elevate the wafer 200 placed on the placing surface 211. In addition, a lower end portion of the shaft 217 is covered with a bellows 219, and thus, the inside of the processing space 201 is hermetically held.

The substrate placing table 212 is configured such that the placing surface 211 is lowered to a position of the substrate loading/unloading port 206 (a wafer conveyance position) upon conveyance of the wafer 200, and the wafer 200 is raised to a processing position (a wafer processing position) in the processing space 201 upon processing of the wafer 200. Specifically, when the substrate placing table 212 is lowered to the wafer conveyance position, upper end portions of the lift pins 207 protrude from an upper surface of the placing surface 211 and the lift pins 207 support the wafer 200 from below. In addition, when the substrate placing table 212 is raised to the wafer processing position, the lift pins 207 are withdrawn from the upper surface of the placing surface 211 and the placing surface 211 supports the wafer 200 from below.

(Shower Head)

A shower head 230 serving as a gas distribution mechanism is installed at an upstream side of the processing space 201. The shower head 230 is inserted into a hole 2021a formed in the upper container 2021.

A lid 231 of the shower head may preferably be formed of a metal having electrical conductivity and thermal conductivity. A block 233 is installed between the lid 231 and the upper container 2021, and the block 233 electrically and thermally insulates between the lid 231 and the upper container 2021.

A through-hole 231a into which a gas supply pipe 241 serving as a first distribution mechanism is inserted is formed in the lid 231 of the shower head. The gas supply pipe 241 inserted into the through-hole 231a is configured to distribute a gas supplied into a buffer chamber serving as a space defined by the shower head 230, and includes a front end portion 241a inserted into the shower head 230 and a flange 241b fixed to the lid 231. The front end portion 241a has a cylindrical shape, and a distribution hole is formed in a side surface of the front end portion 241a. In addition, a gas supplied through a gas supply unit (to be described below) is supplied into the buffer chamber 232 of the shower head 230 through the distribution hole formed in the front end portion 241a.

The shower head 230 also includes a distribution plate 234 serving as a second distribution mechanism configured to distribute the gas supplied through a gas supply system (to be described below). An upstream side of the distribution plate 234 is the buffer chamber 232 of the shower head 230 and a downstream side thereof is the processing space 201. A plurality of through-holes 234a are formed in the distribution plate 234. The distribution plate 234 is disposed above the substrate placing surface 211 to oppose the substrate placing surface 211. Accordingly, the buffer chamber 232 is in communication with the processing space 201 through the plurality of through-holes 234a formed in the distribution plate 234.

The through-hole 231a through which the gas supply pipe 241 is inserted is formed in the buffer chamber 232 of the shower head 230.

(Gas Supply System)

A common gas supply pipe 242 is connected to the gas supply pipe 241 inserted into the through-hole 231a formed in the lid 231 of the shower head. The gas supply pipe 241 and the common gas supply pipe 242 are in communication with each other. The gas supplied into the common gas supply pipe 242 is supplied into the shower head 230 through the gas supply pipe 241 and the through-hole 231a.

A first gas supply pipe 243a, a second gas supply pipe 244a and a third gas supply pipe 245a are connected to the common gas supply pipe 242. The second gas supply pipe 244a is connected to the common gas supply pipe 242 through a remote plasma unit 244e.

A first element-containing gas is mainly supplied through a first gas supply system 243 including the first gas supply pipe 243a, and a second element-containing gas is mainly supplied through a second gas supply system 244 including the second gas supply pipe 244a. An inert gas is supplied through a third gas supply system 245 including the third gas supply pipe 245a when the wafer 200 is processed, and a cleaning gas is supplied through the third gas supply system 245 including the third gas supply pipe 245a when the shower head 230 or the processing space 201 is cleaned.

(First Gas Supply System)

A first gas supply source 243b, a mass flow controller 243c serving as a flow rate controller and a valve 243d serving as an opening and closing valve are installed in sequence at the first gas supply pipe 243a from an upstream side to a downstream side of the first gas supply pipe 243a. In addition, a gas containing a first element (hereinafter, referred to as "a first element-containing gas") is supplied into the shower head 230 from the first gas supply source 243b through the mass flow controller 243c, the valve 243d and the common gas supply pipe 242 installed at the first gas supply pipe 243a.

The first element-containing gas is one of source gases, i.e., processing gases. Here, the first element is, for example, titanium (Ti). That is, the first element-containing gas is, for example, a titanium-containing gas. The first element-containing gas may be a solid, a liquid, or a gas at a normal temperature and a normal pressure. When the first element-containing gas is a liquid at a normal temperature and a normal pressure, an evaporator (not shown) is installed between the first gas supply source 243h and the mass flow controller 243c. Here, an example in which the first element-containing gas is a gas will be described.

A downstream end of a first inert gas supply pipe 246a is connected to a downstream side of the valve 243d installed at the first gas supply pipe 243a. An inert gas support source 246b, a mass flow controller 246c serving as a flow rate controller and a valve 246d serving as an opening and closing valve are installed in sequence at the first inert gas supply pipe 246a from the upstream side to the downstream side of the first inert gas supply pipe 246a. The inert gas is supplied into the shower head 230 from the inert gas support source 246b through the mass flow controller 246c and the valve 246d, which are installed at the first inert gas supply pipe 246a, the first gas supply pipe 243a and the common gas supply pipe 242.

Here, the inert gas may preferably include a gas that serves as a carrier gas of the first element-containing gas and does not react with the first element. Specifically, the inert gas may include, for example, nitrogen ($N_2$) gas. In addition, the inert gas may include a rare gas such as helium (He) gas, neon (Ne) gas or argon (Ar) gas, in addition to $N_2$ gas.

The first gas supply system 243 (also referred to as "a titanium-containing gas supply system") includes the first gas supply pipe 243a, the mass flow controller 243c and the valve 243d. The first gas supply system 243 may further include the first gas supply source 243b and the first inert gas supply system. In addition, the first inert gas supply system may include an inert gas support source 234h and the first gas supply pipe 243a. The first gas supply system 243 is one of the processing gas supply systems because the first gas supply system 243 supplies a source gas that is one of the processing gases.

(Second Gas Supply System)

The remote plasma unit 244e is installed at a downstream side of the second gas supply pipe 244a. A second gas supply source 244b, a mass flow controller 244c serving as a flow rate controller and a valve 244d serving as an opening and closing valve are installed in sequence at the second gas supply pipe 244a from the upstream side to the downstream side of the second gas supply pipe 244a. A gas containing a second element (hereinafter, referred to as "a second element-containing gas") is supplied into the shower head 230 from the second gas supply source 244b through the mass flow controller 244c and the valve 244d, which are installed at the second gas supply pipe 244a, the remote plasma unit 244e and the common gas supply pipe 242. Here, the second element-containing gas is excited to a plasma state by the remote plasma unit 244e to be supplied onto the wafer 200.

The second element-containing gas is one of the processing gases and serves as an active gas or a modifying gas. The second element-containing gas contains a second element different from the first element. The second element may be any one of oxygen (O), nitrogen (N) and carbon (C). In the embodiment, the second element-containing gas is, for example, a nitrogen-containing gas. Specifically, ammonia ($NH_3$) may be used as a nitrogen-containing gas.

A downstream end of a second inert gas supply pipe 247a is connected to a downstream side of the valve 244d of the second gas supply pipe 244a. An inert gas support source 247b, a mass flow controller 247c serving as a flow rate controller and a valve 247d serving as an opening and closing valve are installed at the second inert gas supply pipe 247a in sequence from the upstream side to the downstream side of the second inert gas supply pipe 247a. The inert gas is supplied into the shower head 230 from the inert gas support source 247b through the mass flow controller 247c and the valve 247d, which are installed at the second inert gas supply pipe 247a, the second gas supply pipe 244a and the common gas supply pipe 242.

The inert gas serves as a carrier gas or a dilution gas in the substrate processing process according to the embodiment. Specifically, the inert gas may include a rare gas such as He gas, Ne gas or Ar gas, in addition to $N_2$ gas.

The second gas supply system 244 (referred to as "a nitrogen-containing gas supply system") includes the second gas supply pipe 244a, the mass flow controller 244c and the valve 244d. In addition, the second inert gas supply system includes the second inert gas supply pipe 247a, the mass flow controller 247c and the valve 247d. The second gas supply system 244 may further include the second gas supply source 244b, the remote plasma unit 244e and the second inert gas supply system. The second inert gas supply system may further include the inert gas support source 247b, the second gas supply pipe 244a and the remote plasma unit 244e. The second gas supply system 244 is one of the processing gas supply systems configured to supply an active gas or a modifying gas that is one of the processing gases.

(Third Gas Supply System)

A third gas supply source 245b, a mass flow controller 245c serving as a flow rate controller and a valve 245d serving as an opening and closing valve are installed in sequence at the third gas supply pipe 245a from the upstream side to the downstream side of the third gas supply pipe 245a. The inert gas is supplied into the shower head 230 from the third gas supply source 245b through the mass flow controller 245c and the valve 245d, which are installed at the third gas supply pipe 245a, and the common gas supply pipe 242.

The inert gas supplied from the third gas supply source 245b serves as a purge gas that purges gas remaining in the processing container 202 or the shower head 230 in the substrate processing process. The inert gas may include a rare gas such as He gas, Ne gas or Ar gas, in addition to $N_2$ gas.

(Gas Exhaust System)

The exhaust system configured to exhaust the atmosphere of the processing container 202 includes a plurality of exhaust pipes connected to the processing container 202. Specifically, the exhaust system includes an exhaust pipe 261 (a first exhaust pipe) connected to the conveyance space 203, an exhaust pipe 263 (a second exhaust pipe) connected to the processing space 201 and an exhaust pipe 264 (a third exhaust pipe) connected to a downstream side of the exhaust pipes 261 and 263.

The exhaust pipe 261 is connected to a side surface or a bottom surface of the conveyance space 203. A turbo molecular pump (TMP) 265 (hereinafter, referred to as "a first vacuum pump") serving as a vacuum pump configured to realize a high vacuum or an ultrahigh vacuum is installed at the exhaust pipe 261. Valves 266 and 267 serving as opening and closing valves are installed at the exhaust pipes 261 of the upstream side and the downstream side of the IMP 265, respectively.

The exhaust pipe 263 is connected to a side of the processing space 201. An auto pressure controller (APC) 276 serving as a pressure controller configured to control an internal pressure of the processing space 201 to a predetermined pressure is installed at the exhaust pipe 263. The APC 276 includes a valve body (not shown) configured to adjust an opening angle, and adjusts conductance of the exhaust pipe 263 according to an instruction from the controller 280. In addition, valves 275 and 277 serving as opening and closing valves are installed at an upstream side and a downstream side of the APC 276 of the exhaust pipe 263.

A dry pump (DP) 278 is installed at the exhaust pipe 264. As shown, the exhaust pipe 263 and the exhaust pipe 261 are connected to an upstream side of the exhaust pipe 264, and the DP 278 is installed at a downstream side of the exhaust pipe 263 and the exhaust pipe 261. The DP 278 exhausts the atmosphere of the processing space 201 and the conveyance space 203 through the exhaust pipe 263 and the exhaust pipe 261. The DP 278 may function as an auxiliary pump when the TMP 265 is operated. That is, since it is difficult for the TMP 265 serving as a high vacuum (or an ultrahigh vacuum) pump to solely perform the exhausting of the atmospheric pressure, the DP 278 is used as an auxiliary pump configured to perform the exhausting of the atmospheric pressure.

(3) Mounting Type of Cooling Mechanism

Hereinafter, a type of a cooling mechanism installed at each of the process modules PM1 through PM4 will be described in detail.

First, a reason for installing the cooling mechanism will be described. When a film is formed on the wafer, the wafer may be at a high temperature. This is because, when the wafer is at the high temperature, energy of the gas supplied into the reaction chamber is higher than that at a low temperature (for example, a normal temperature, a room temperature) and reaction on the wafer is activated. On the other hand, a peripheral structure of the reaction chamber may be at a low temperature for the purpose of an operation of the apparatus. A problem generated when the apparatus is operated at the high temperature is, for example, a thermal resistance of an O-ring 209 (a sealing member), contamination of a metal of the lower container 2022, and so on. The O-ring is deformed or broken when the temperature is higher than a heat resisting temperature to cause a decrease in sealability or generation of foreign substances, thereby deteriorating thermal durability of the O-ring 209. It is an metal contamination problem that an unexpected metal ingredient is extracted from the member that constitutes the lower container 2022 or a peripheral material at a high temperature to become particles which lead to a contamination of the film. In addition, when the heat is transferred to a driving unit such as the elevation unit 218, a performance of the driving unit is decreased due to a deterioration of the grease. Accordingly, even when the substrate is processed while maintaining the reaction chamber at a high temperature, the peripheral structure of the reaction chamber may be maintained at a low temperature.

In addition, the following problems occur from the configuration in which the reaction chambers are adjacent to each other like in the embodiment. For example, in general, when a plurality of wafers are continuously processed, heat of the heater is accumulated in the peripheral structure of the reaction chamber. Accordingly, a thermal budget of the structure is increased to increase the temperature. Here, the peripheral structure of the reaction chamber is, for example, the shower head, the sidewalk of the reaction chamber, the sidewalls of the transfer chamber, or the like.

In the case of the plurality of reaction chambers are provided and the partition wall 204c is installed between the reaction chambers like in the embodiment, the partition wall 204c is heated by the heater installed at the reaction chamber. Accordingly, a partition wall 204c' (shown in FIG. 4A, to be described below in detail) is at a higher temperature than the other sidewalls due to heat transfer. As a result, a reduction of a metal ingredient in the partition wall 204c' or a reduction in performance of the driving unit may occur further than the other sidewalls. Accordingly, when the plurality of reaction chambers are included the partition wall 204c' may be maintained at a low temperature. In addition, since the partition wall 204c and the partition wall 204c' are sidewalls shared by reaction chambers RCL and RCR and transfer chambers 203L and 203R the partition wall 204c and the partition wall 204c' are referred to as a common sidewall (a first sidewall), and a sidewall except for the partition wall 204c and the partition wall 204c' is referred to as an outer sidewall (a second sidewall).

In order to solve the problem, while the heater may be maintained at a lower temperature to reduce an influence on the peripheral structure, the quality of the film is decreased if a film-forming temperature does not satisfy a desired temperature. For example, when the film is formed at a low temperature, a decomposition or reaction of the gas is insufficient to form a film having a low density or a film having a low degree of coupling.

Accordingly, the sidewall of the transfer chamber may be maintained at a low temperature while maintaining a desired wafer temperature.

Figure 4A:
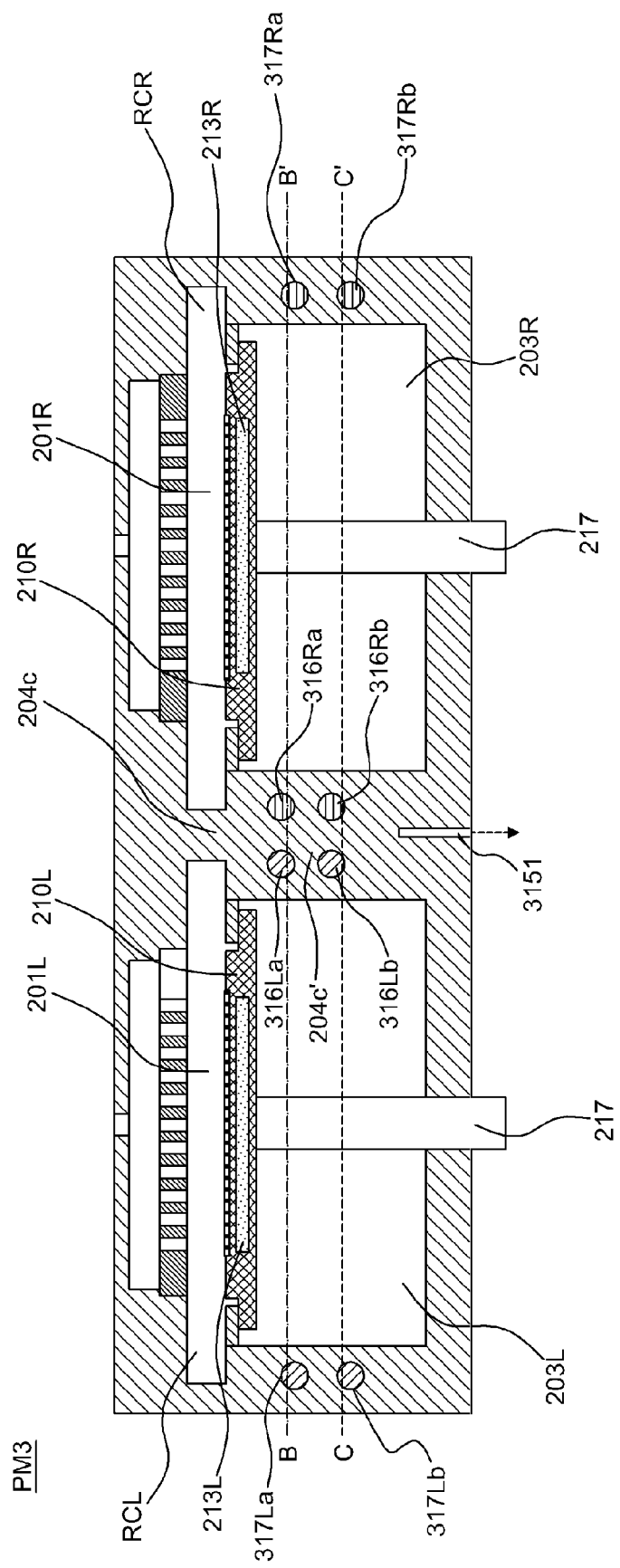
Figure 4B:
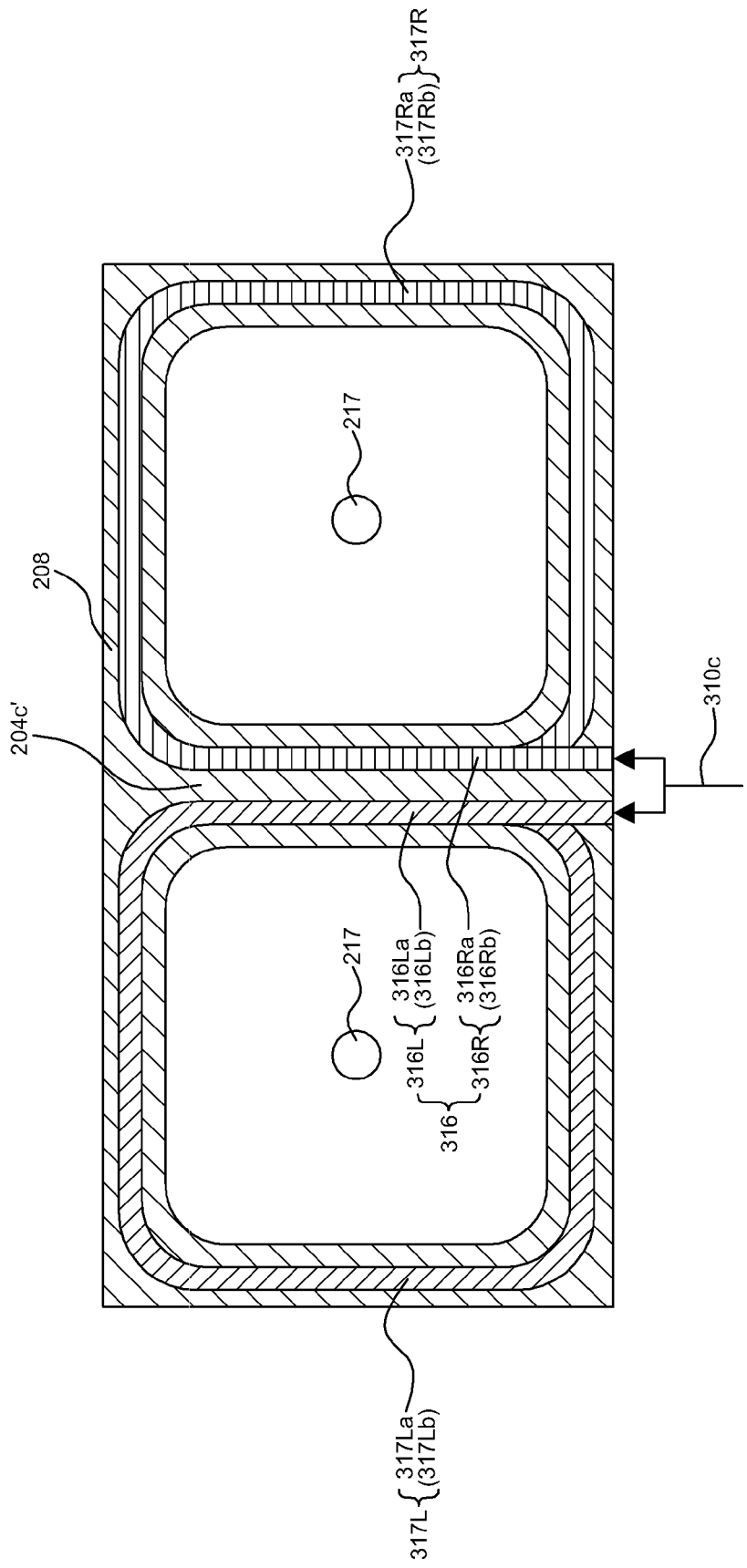

A configuration of a cooling mechanism (a pipe) that can continuously maintain the sidewall of the transfer chamber at a low temperature while maintaining a desired wafer temperature will be described in detail with reference to FIGS. 4A through 4C. FIGS. 4A through 4C are views schematically showing an exemplary configuration of the cooling mechanism (the pipe) of the substrate processing apparatus according to the first embodiment. FIGS. 4A, 4B and 4C are cross-sectional views taken along line A-A' of FIG. 1, line B-B' of FIG. 4A and line C-C' of FIG. 4A, respectively.

As described above, each of the process modules PM1 through PM4 includes, for example, two reaction chambers. FIG. 4A shows a configuration in which, for example, the process module PM3 includes two reaction chambers RCL and RCR and the transfer chambers 203L and 203R disposed under the reaction chambers RCL and RCR. The reaction chamber RCL corresponds to the reaction chambers RC1, RC3, RC5 and RC7 of FIG. 1, and the reaction chamber RCR corresponds to the reaction chambers RC2, RC4, RC6 and RC8 of FIG. 1. The reaction chambers RCL and RCR are disposed adjacent to each other and inner atmospheres thereof are isolated from each other. Similarly, the transfer chambers 2031, and 203R are disposed adjacent to each other and inner atmospheres thereof are isolated from each other.

The reaction chambers RCL and RCR and the transfer chambers 203L and 203R are configured as shown in FIG. 3, and a metal material such as Al or SUS is used as a main material that constitutes a sidewall (a common wall) limiting the reaction chambers RCL and RCR and the transfer chambers 203L and 203R (i.e., a material that constitutes the lower container 2022). The pipes 310a through 310d through which the thermal medium supplied from the temperature adjustment unit 320 flows are partially installed at the sidewall 204c' of each of the transfer chambers 203L and 203R.

In addition, reference numerals shown in FIGS. 4A through 4C designate the following parts. A heater installed at the reaction chamber RCL is a heating unit 213L (a first heating unit), and a heater installed at the reaction chamber RCR is a heating unit 213R (a second heating unit). A processing space included in the reaction chamber RCL in which the wafer is processed is a processing space 201L (a first processing space) and a processing space included in the reaction chamber RCR is a processing space 201R (a second processing space). A space in the transfer chamber 203L disposed under the processing space 201L is a first conveyance space and a space in the transfer chamber 203R is a second conveyance space.

The transfer chambers 203L and 203R are adjacent to and in line with each other. Pipes of the transfer chambers 203L and 203R are installed in the partition wall 204c' that separates the transfer chambers 203L and 203R. That is, the sidewall of each of the transfer chambers 203L and 203R is constituted by the partition wall 204c' between the transfer chambers 203L and 203R and the outer sidewall 208 exposed along outer circumferences of the transfer chambers 203L and 203R. Pipes of the transfer chambers 203L and 203R include a penetrating pipe 316 serving as a flow path section installed in the partition wall 204c' between the transfer chambers 203L and 203R, and the peripheral pipe 317 serving as a flow path section installed in the outer sidewall 208 of the transfer chambers 203L and 203R.

As shown in FIGS. 4A through 4C, the penetrating pipe 316 and a peripheral pipe 317 are installed in a spiral shape from an upper section toward a lower section of the sidewall of the transfer chambers 203L and 203R. However, the penetrating pipe 316 passes through the partition wall 204c between the transfer chambers 203L and 203R. Since the peripheral pipes 317 pass through the outer sidewalls of the transfer chambers 203L and 203R, the peripheral pipes 317 are installed at the outer sidewalk of the transfer chambers 203L and 203R, respectively.

As shown in FIGS. 4B and 4C, the penetrating pipe 316R includes an upper penetrating pipe 316Ra serving as an upper portion of a spiral pipe, and a lower penetrating pipe 316Rb serving as a lower portion of the spiral pipe. Similarly, the penetrating pipe 316L includes an upper penetrating pipe 316La serving as an upper portion of the spiral pipe, and a lower penetrating pipe 316Lb serving as a lower portion of the spiral pipe.

In addition, the peripheral pipe 317R includes an upper peripheral pipe 317Ra serving as an upper portion of the spiral pipe, and a lower peripheral pipe 317Rb serving as a lower portion of the spiral pipe. The peripheral pipe 317L includes an upper peripheral pipe 317La serving as an upper portion of the spiral pipe and a lower peripheral pipe 317Lb serving as a lower portion of the spiral pipe. While FIG. 4 shows an example in which the spiral pipe includes two portions that are the upper portion and the lower portion, the example is not limited thereto but the spiral pipe may be appropriately set according to sizes or pipe diameters of the reaction chambers RCL and RCR.

As shown in FIG. 4B, the pipe 310c through which the thermal medium is supplied is connected to an upstream side of the upper penetrating pipe 316Ra and the upper penetrating pipe 316La corresponding to the upper portion of the spiral pipe of the penetrating pipe 316. The pipe 310c through which the thermal medium is discharged is connected to a downstream side of the lower penetrating pipe 316Rb and the lower penetrating pipe 316Lb. According to the above-mentioned configuration, the thermal medium having high cooling efficiency is supplied into the upper penetrating pipe 316Ra and the upper penetrating pipe 316La. In addition, the thermal medium passing through the upper penetrating pipe 316Ra and the upper penetrating pipe 316La is supplied into the lower penetrating pipe 316Rb and the lower penetrating pipe 316Lb.

The upper penetrating pipe 316Ra and the upper penetrating pipe 316La are installed at a position lower than the heating unit 213 of the substrate support unit 210. According to the above-mentioned configuration, an influence of the heat of the heating unit 213 applied to the sidewall of the transfer chamber 203 can be reduced. Accordingly, an influence of the metal extracted from the sidewall of the transfer chamber 203 in the high temperature state can be reduced, and the deformation of the O-ring 209 can be prevented.

More preferably, the lower penetrating pipe 316Rb and the lower penetrating pipe 316Lb are installed higher than the O-ring 209. Accordingly, a thermal influence on the O-ring 209 can be more reliably suppressed to prevent the deformation of the O-ring 209.

The sensor 3151 configured to detect a temperature of the partition wall 204c' is installed at the partition wall 204c'.

As described above, the pipes 310a through 310d including the penetrating pipe 316 and the peripheral pipe 317 are formed of a metal material having a high thermal conductivity such as aluminum (Al) or the like.

(4) Substrate Processing Process

Next, a semiconductor manufacturing process of forming a thin film on the wafer 200 using the reaction chambers RCL and RCR having the above-mentioned configuration will be described. In addition, operations of the parts that constitute the substrate processing apparatus in the following description are controlled by the controller 280.

In the embodiment, an example in which a titanium nitride (TINT) film serving as a metal thin film on the wafer 200 is formed by using $TiCl_4$ gas obtained by evaporating $TiCl_4$ serving as a first element-containing gas (a first processing gas) and using $NH_3$ gas serving as a second element-containing gas (a second processing gas) and by alternately supplying the gases will be described.

Figure 5:
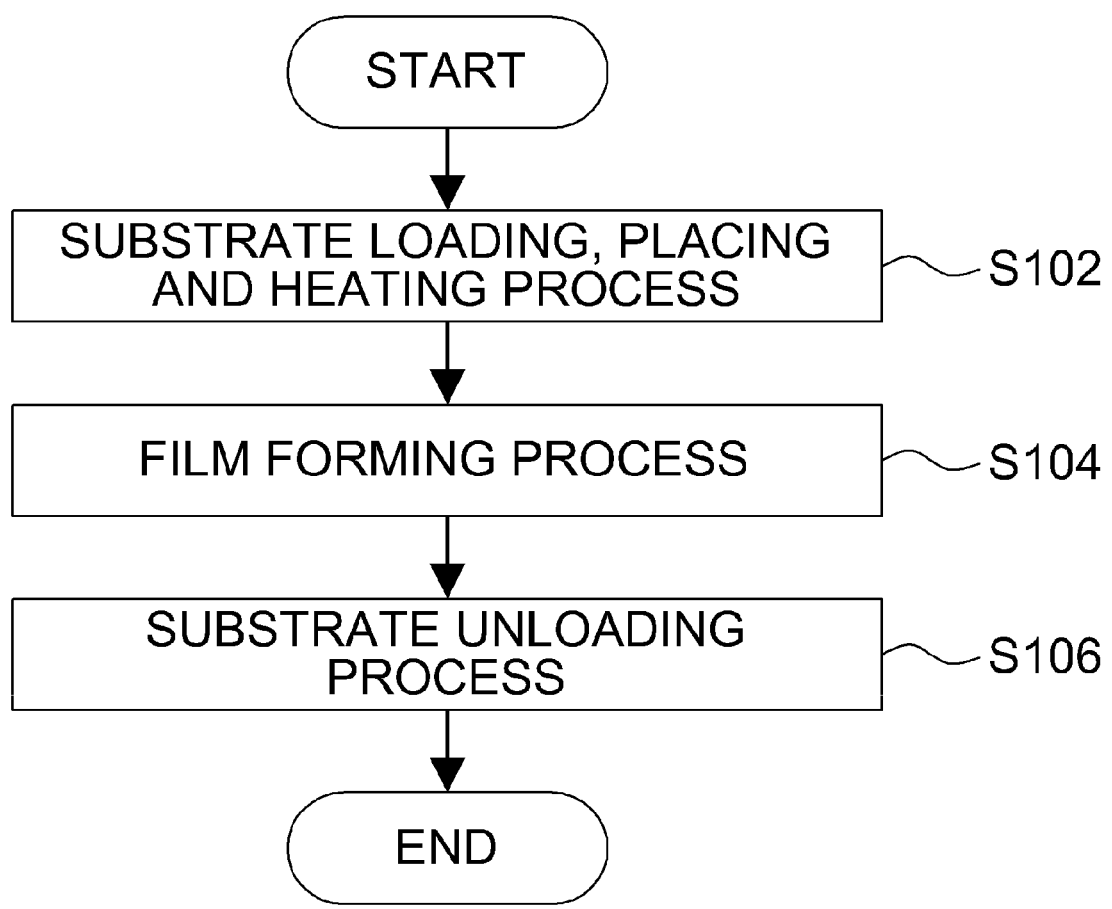
FIG. 5 is a flowchart illustrating a substrate processing process according to the first embodiment of the present invention.
Figure 6:
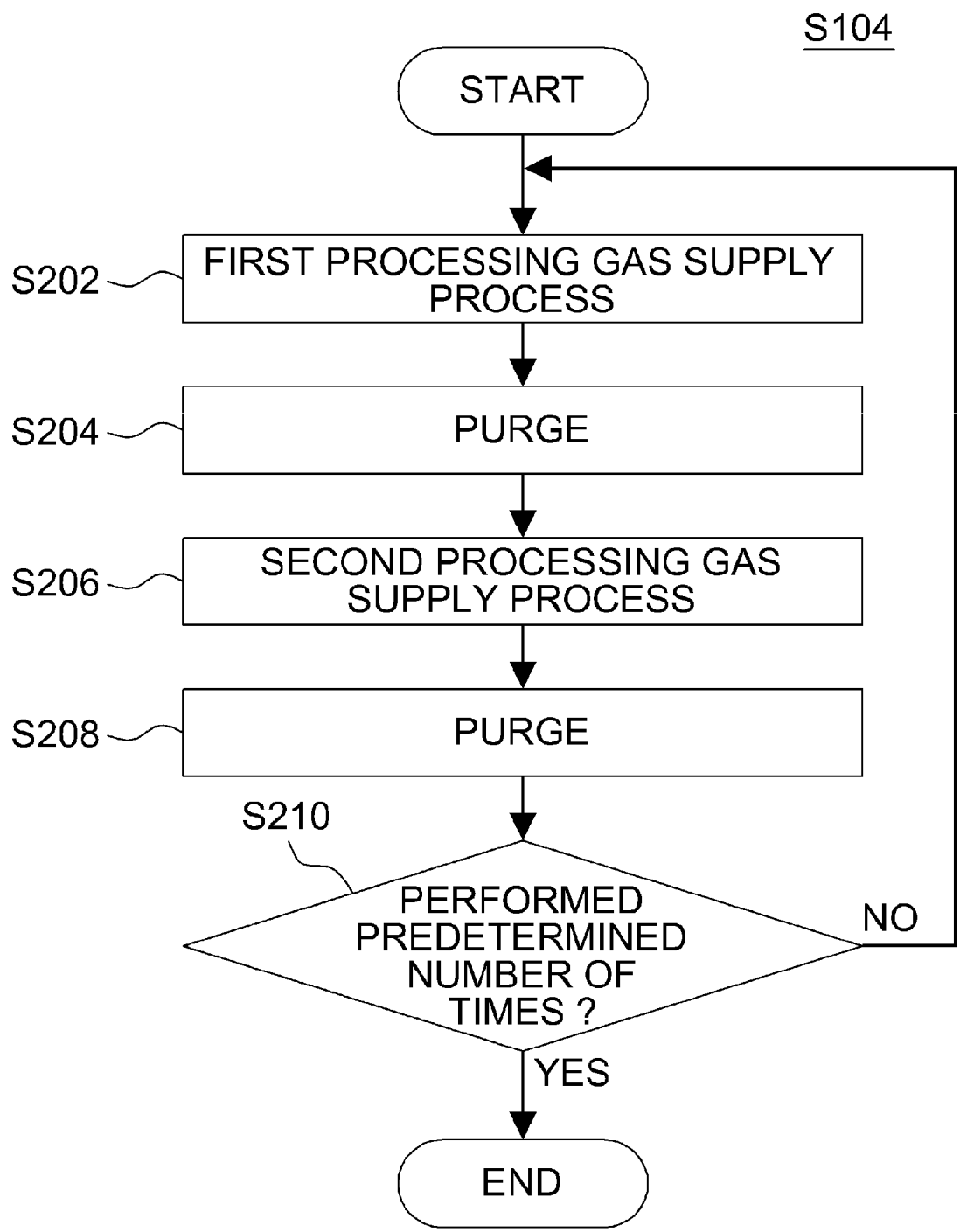
FIG. 6 is a flowchart specifically illustrating a film forming process of the substrate processing process of FIG. 5.

FIG. 5 is a flowchart illustrating a substrate processing process according to the embodiment. FIG. 6 is a flowchart specifically illustrating a film forming process of FIG. 5.

(Substrate Loading, Placing and Heating Process: S102)

When the substrate placing table 212 is first lowered to a conveyance position of the wafer 200 in each of the reaction chambers RCL and RCR, the lift pins 207 pass through the through-holes 214 of the substrate placing table 212. As a result, the lift pins 207 protrude from the surface of the substrate placing table 212 to a predetermined height. Then, as the gate valve 205 is opened, the conveyance space 203 and the vacuum transfer chamber 140 are in communication with each other. Next, the wafer 200 is conveyed from the vacuum transfer chamber 140 to the conveyance space 203 using the vacuum conveyance robot 170, and the wafer 200 is placed on the lift pins 207. Accordingly, the wafer 200 is horizontally supported on the lift pins 207 protruding from the surface of the substrate placing table 212. In the embodiment, substrates are loaded into both of the reaction chambers RCL and RCR.

After the wafer 200 is loaded into the processing container 202, the processing container 202 is sealed by withdrawing the vacuum conveyance robot 170 to the outside of the processing container 202 and closing the gate valve 205. Next, the wafer 200 is placed onto the substrate placing surface 211 of the substrate placing table 212 by raising the substrate placing table 212, and the wafer 200 is raised to the processing position in the above-mentioned processing space 201 by raising the substrate placing table 212.

When the wafer 200 is raised to the processing position in the processing space 201 after the wafer 200 is loaded into the conveyance space 203, the valve 266 and the valve 267 are closed. Accordingly, a space between the conveyance space 203 and the TMP 265 and a space between the TMP 265 and the exhaust pipe 264 are blocked, and an exhausting of the conveyance space 203 by the TMP 265 is terminated. By opening the valve 277 and the valve 275, the processing space 201 and the APC 276 are in communication with each other and the APC 276 and the DP 278 are in communication with each other. The APC 276 controls an exhaust flow rate of the processing space 201 using the DP 278 and maintains the processing space 201 at a predetermined pressure (for example, a high vacuum of $10^{-5}$ Pa to $10^{-1}$ Pa) by adjusting a conductance of the exhaust pipe 263.

As described above, in a substrate loading, placing and heating process (S102), the internal pressure of the processing space 201 is controlled to a predetermined pressure, and a surface temperature of the wafer 200 is controlled to a predetermined temperature. Here, the predetermined temperature and the predetermined pressure are referred to as a temperature and a pressure at which a TiN film is formed by alternately supplying gases in a film forming process (S104) (to be described below). That is, the predetermined temperature and the predetermined pressure are referred to as a temperature and a pressure at which a first element-containing gas (a source gas) supplied in a first processing gas supply process (S202) does not self-decompose. Specifically, the predetermined temperature may range from room temperature to 500° C., preferably, may range from room temperature to 400° C., and the predetermined pressure may range from 50 Pa to 5,000 Pa. The temperature and the pressure are also maintained in the film forming process (S104) (to be described below).

(Film Forming Process: S104)

After the substrate loading, placing and heating process (S102) is performed, the film forming process (S104) is performed. Hereinafter, the film forming process (S104) will be described in detail with reference to FIG. 5. In addition, the film forming process (S104) is a cyclic processing in which a process of alternately supplying the other processing gases is repeated.

(First Processing Gas Supply Process: S202)

In the film forming process (S104), first, the first processing gas supply process (S202) is performed. In the first processing gas supply process (S202), the valve 243d is opened and the mass flow controller 243c is adjusted to supply $TiCl_4$ gas that is a first element-containing gas serving as a first processing gas at a predetermined flow rate. Accordingly, the $TiCl_4$ gas is supplied into the processing space 201. In addition, a flow rate of the $TiCl_4$ gas may range from 100 sccm to 5,000 sccm. Simultaneously, as the valve 245d of the third gas supply system is opened, the $N_2$ gas is supplied through the third gas supply pipe 245a. The $N_2$ gas can also be supplied through the first inert gas supply system. Before performing the first processing gas supply process (S202), the $N_2$ gas may also be supplied through the third gas supply pipe 245a.

The $TiCl_4$ gas supplied into the processing space 201 is supplied onto the wafer 200. When the $TiCl_4$ gas comes in contact with the surface of the wafer 200, the titanium-containing layer serving as "the first element-containing layer" is formed.

The titanium-containing layer has a predetermined thickness and a predetermined distribution according to, for example, an internal pressure of the processing container 202, a flow rate of the $TiCl_4$ gas, a temperature of the substrate support unit 210, a time in which the $TiCl_4$ gas stays in the processing space 201, and so on. A predetermined film may be formed on the wafer 200 in advance. A predetermined pattern may also be formed on the wafer 200 or the predetermined film in advance.

When a predetermined time elapses after the supply of the $TiCl_4$ gas, the valve 243d is closed to stop the supply of the $TiCl_4$ gas. A supply time of the $TiCl_4$ gas may range from 2 seconds to 20 seconds.

In the first processing gas supply process (S202), the valve 275 and the valve 277 are opened, and the pressure of the processing space 201 is adjusted to the predetermined pressure by the APC 276. In the first processing gas supply process (S202), the valves of the exhaust system other than the valve 275 and the valve 277 are all closed.

(Purge Process: S204)

After stopping the supply of the $TiCl_4$ gas, the $N_2$ gas is supplied through the third gas supply pipe 245a to purge the processing space 201. Here, the valve 275 and the valve 277 are opened, and the pressure of the processing space 201 is adjusted to the predetermined pressure by the APC 276. Meanwhile, the valves of the exhaust system other than the valve 275 and the valve 277 are all closed. Accordingly, the $TiCl_4$ gas that is not coupled to the wafer 200 in the first processing gas supply process (S202) is removed from the processing space 201 through the exhaust pipe 263 by the DP 278.

In order to remove the $TiCl_4$ gas remaining on the wafer 200 and in the processing space 201 and the buffer chamber 232 of the shower head 230, a large amount of purge gas can be supplied to increase exhaust efficiency in a purge process (S204).

When the purge process is terminated, the valve 277 and the valve 275 are opened and the pressure control by the APC 276 is restarted. Here, the other valves of the exhaust system are closed. Even when the pressure control by the APC 276 is performed, the shower head 230 and the processing space 201 can be continuously purged by continuously supplying the $N_2$ gas through the third gas supply pipe 245a.

(Second Processing Gas Supply Process: S206)

After the purge process of the buffer chamber 232 of the shower head 230 and the processing space 201 is terminated, a second processing gas supply process (S206) is performed. In the second processing gas supply process (S206), the $NH_3$ gas that is a second element-containing gas serving as a second processing gas is supplied into the processing space 201 via the remote plasma unit 244e and the shower head 230 at a predetermined flow rate by adjusting the mass flow controller 244c while opening the valve 244d. The flow rate of the $NH_3$ gas may range from 1,000 sccm to 10,000 sccm. Simultaneously, as the valve 245d of the third gas supply system is opened in the second processing gas supply process (S206), the $N_2$ gas may be supplied through the third gas supply pipe 245a. Intrusion of the $NH_3$ gas into the third gas supply system is prevented by the $N_2$ gas.

The $NH_3$ gas excited to the plasma state by the remote plasma unit 244e is supplied into the processing space 201 via the shower head 230. The supplied NH gas reacts with a titanium-containing layer on the wafer 200. The titanium-containing layer is reformed by the $NH_3$ gas in the plasma state. Accordingly, for example, a TiN layer containing titanium and nitrogen is formed on the wafer 200.

The TiN layer has a predetermined thickness, a predetermined distribution and an intrusion depth of a nitrogen element of the titanium-containing layer according to, for example, an internal pressure of the processing container 202, a flow rate of the $NH_3$ gas, a temperature of the substrate support unit 210, a power supply state of a plasma generating unit, and so on.

When a predetermined time elapses after the supply of the $NH_3$ gas, the valve 244d is closed to stop the supply of the $NH_3$ gas. A supply time of the $NH_3$ gas may range from 2 seconds to 20 seconds.

Like the first processing gas supply process (S202), in the second processing gas supply process (S206), the valve 275 and the valve 277 are opened, and the pressure of the processing space 201 is adjusted to the predetermined pressure by the APC 276. In addition, the valves of the exhaust system other than the valve 275 and the valve 277 are all closed.

(Purge Process: S208)

After stopping the supply of the $NH_3$ gas, a purge process (S208) equal to the purge process (S204) is performed. Detailed description of operations of the parts of the purge process (S208) will be omitted since the operations are the same as the above-mentioned purge process (S204).

(Determination Process: S210)

The controller 280 determines whether a cycle including the first processing gas supply process (S202), the purge process (S204), the second processing gas supply process (S206) and the purge process (S208) is performed a predetermined number of times (n cycles) (S210). When the cycle is performed a predetermined number of times, the TiN layer having a desired thickness is formed on the wafer 200.

(Substrate Unloading Process: S106)

Referring back to FIG. 5, after performing the film forming process (S104) including processes (S202 through S210), a substrate unloading process (S106) is performed. In the substrate unloading process (S106), the processed wafer 200 is unloaded from the processing container 202.

(Processing of Unprocessed Substrate)

Processes (S102, S104 and S106) can be performed on an unprocessed wafer 200 in the atmosphere.

(5) Temperature Adjustment Processing by Temperature Adjustment System

Next, a process of adjusting temperatures of the reaction chambers RC1 through RC8 using the temperature adjustment system 20 when substrate processing processes (S102 through S106) are performed will be described with reference to FIG. 1. In addition, in the following description, operations of the parts that constitute the temperature adjustment system 20 are controlled by the controller 280.

(Supply of Thermal Medium)

While the substrate processing processes (S102 through S106) are performed in the reaction chambers RC1 through RC8 of the process modules PM1 through PM4, the temperature adjustment unit 320 of the temperature adjustment system 20 operates the pump 324 or the like to supply the thermal medium into the pipes 310a through 310d. As heat exchange with the thermal medium is performed in the reaction chambers RC1 through RC8, the transfer chambers are maintained at a predetermined temperature (for example, about 50° C.).

Here, the sensor 3151 installed at the partition wall 204c can detect a temperature of the partition wall 204c. Data detected by the sensor 3151 is transmitted to the transmission/reception unit 284 of the controller 280. The calculation unit 281 reads a temperature control table recorded in the storage unit 282 (or an external storage unit 283). The calculation unit 281 calculates a control value of the temperature adjustment unit 320 by comparing the data received by the transmission/reception unit 284 with the table, and controls the temperature adjustment unit 320 based on the control value. For example, the calculation unit 281 controls the temperature adjustment unit 320 to decrease the temperature of the partition wall 204c when the temperature of the received data is higher than a desired temperature. Specifically, the temperature adjustment units 320a through 320d are controlled based on the data detected by the sensors 3151 of the process modules PM1 through PM4, respectively. That is, the controller 280 is configured to control the temperature adjustment unit 320 based on the data detected by each sensor 3151.

(Detection by Sensor)

The sensor 3151 configured to detect a state of the thermal medium can measure, for example, the temperature of the partition wall 204c'. The sensors 3151 are installed at the process modules PM1 through PM4, respectively.

(State Control of Thermal Medium Based on Detection by Sensor)

When the sensors 3151 of the process modules PM1 through PM4 detect the state of the thermal medium, the temperature adjustment unit 320 controls the state of the thermal medium as described below. For example, when the temperature detected by the sensor 3151 is lower than a predetermined temperature range, the temperature adjustment unit 320 heats the thermal medium using the heating unit 322 such that the temperature of the thermal medium is within the predetermined temperature range. On the other hand, when the temperature detected by the sensor 3151 is higher than the predetermined temperature range, the temperature adjustment unit 320 cools the thermal medium using the cooling unit 323 such that the temperature of the thermal medium is within the predetermined temperature range.

As described above, the temperature adjustment unit 320 controls the thermal media flowing through the pipes 310a through 310d to predetermined states based on detection of the sensors 3151, respectively. That is, the temperature adjustment unit 320 controls the state of the thermal medium to recover the predetermined state when the thermal medium is out of the predetermined state. Accordingly, the thermal medium supplied to the process modules PM1 through PM4 is maintained in the predetermined state by the temperature adjustment unit 320.

The temperature adjustment unit 320 independently recovers the state of the thermal medium. That is, even when the temperature adjustment unit 320a recovers the state of the thermal medium based on the detection of the sensor 3151 of the process module PM1 corresponding to the temperature adjustment unit 320a, the temperature adjustment units 320b through 320d do not receive an influence of the temperature adjustment unit 320a. Accordingly, for example, even when lengths of the pipes 310a through 310d of the process modules PM1 through PM4 are different according to installation environments such as cleanliness in a clean room, the states of the thermal media supplied into the process modules PM1 through PM4 can be substantially uniformized without being affected by a difference in length.

Second Embodiment of the Invention

Figure 7:
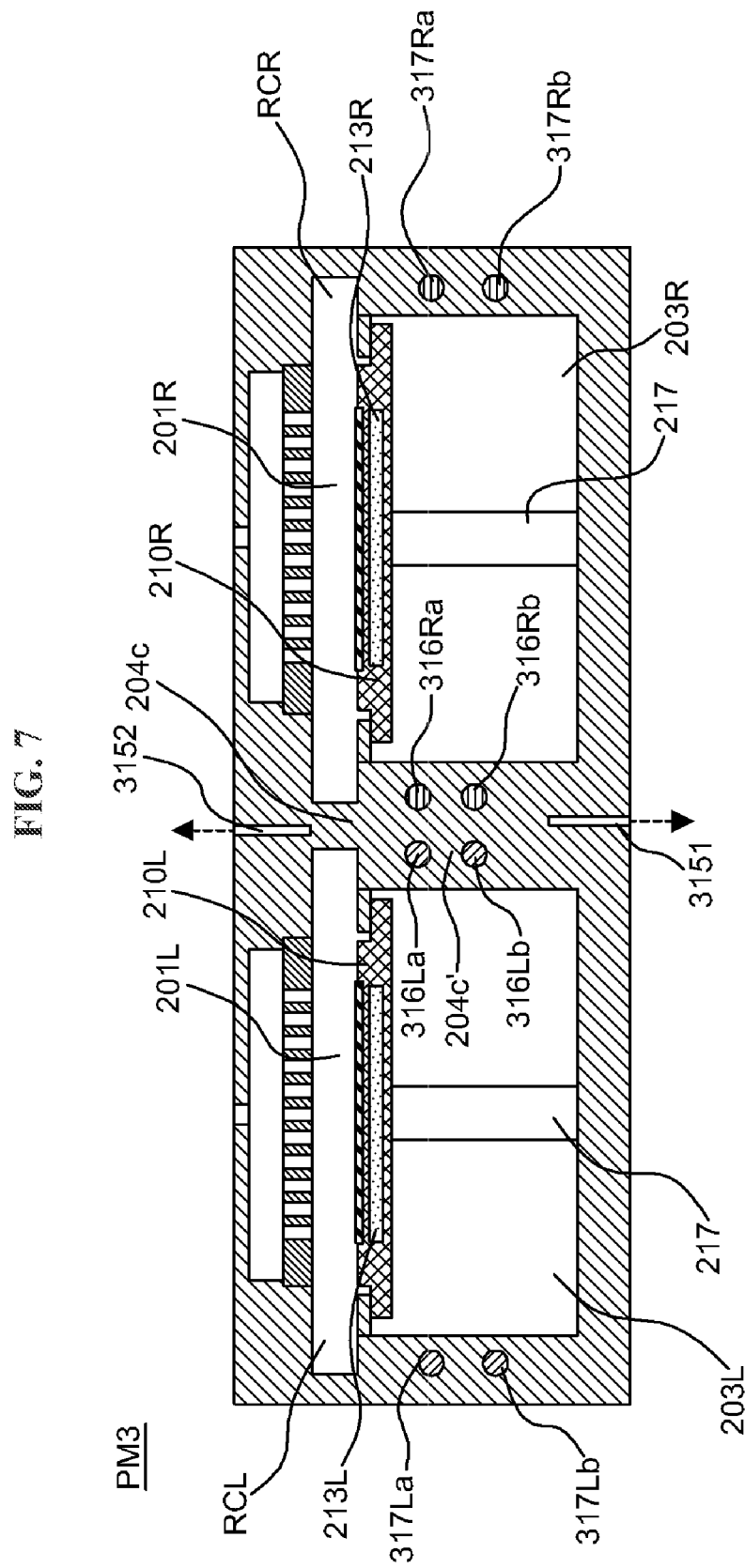
FIG. 7 is a diagram schematically illustrating a substrate processing apparatus according to a second embodiment of the present invention.

Next, a second embodiment according to the present invention will be described with reference to FIG. 7. Similar to FIG. 4A illustrating the first embodiment, FIG. 7 is a cross-sectional view taken along line A-A' of FIG. 1. The second embodiment is distinguished from the first embodiment in that sensors 3152 are added to the process modules according to the second embodiment. That is, similar to the sensors 3151, the sensors 3152 are installed at the process modules PM1 through PM4, respectively.

The sensors 3152 are installed above the partition walls 204c' in the process modules PM1 through PM4 to detect temperatures of the partition walls 204c. As the sensors 3152 and the sensors 3151 detects the temperatures of the partition walls 204c and the partition walls 204c', respectively, the temperatures of the partition walls can be more accurately measured and the temperatures of the partition walls 204c and 204c' can be more accurately controlled.

Third Embodiment of the Invention

Figure 8:
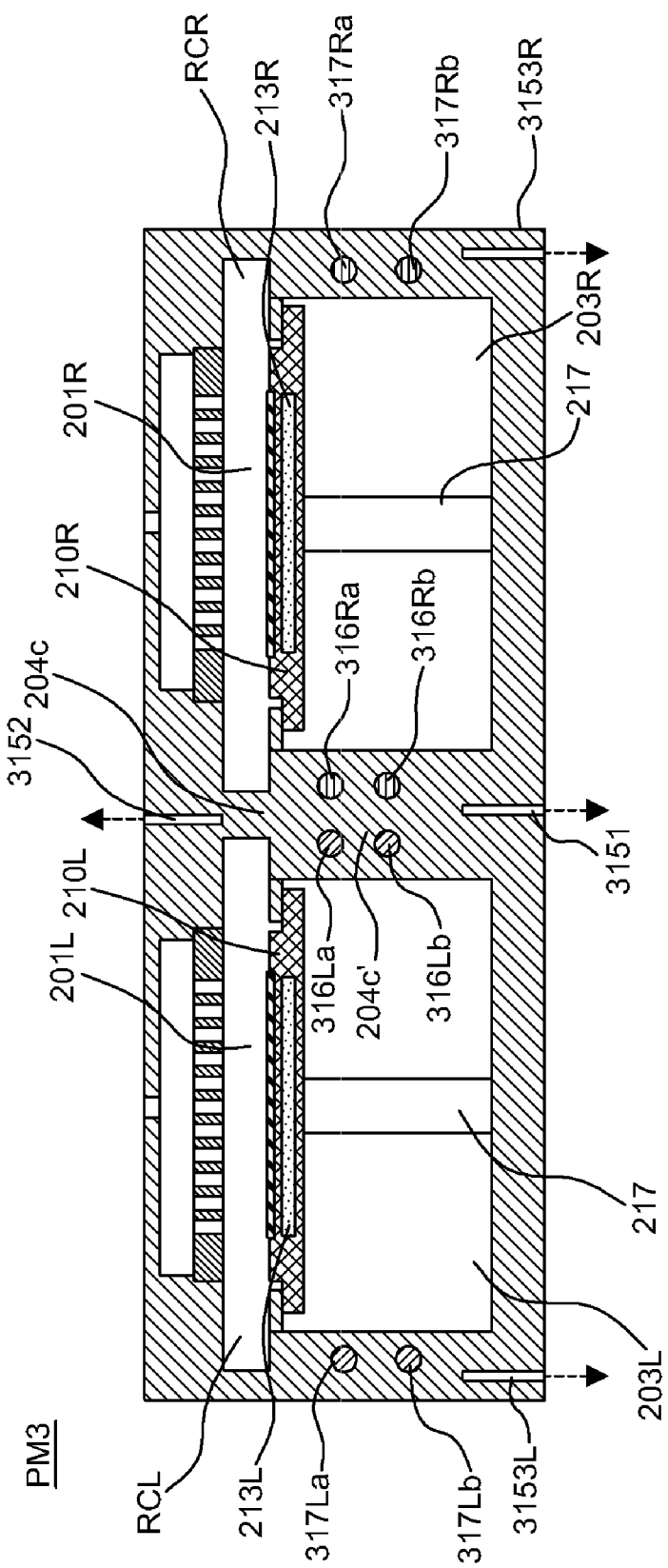
FIG. 8 is a diagram schematically illustrating a substrate processing apparatus according to a third embodiment of the present invention.

Next, a third embodiment according to the present invention will be described with reference to FIG. 8. Similar to FIG. 4A illustrating the first embodiment, FIG. 8 is a cross-sectional view taken along line A-A' of FIG. 1. The third embodiment is distinguished from the first embodiment in that sensors 3153R and 3153L are added to the process modules of the third embodiment. That is, the sensors 3153R and 3153L are installed at the process modules PM1 through PM4, respectively.

The sensor 3153R is installed in the vicinity of the lower peripheral pipe 317Rb in the sides, all 208 of the transfer chamber 203R of each of the process modules PM1 through PM4. The sensor 3153L is installed in the vicinity of the lower peripheral pipe 317Lb in the sidewall 208 of the transfer chamber 203L of each of the process modules PM1 through PM4.

A partial deviation in temperature in a horizontal direction can be suppressed by detecting a difference in temperature between the partition wall 204c' and the sidewall 208 and controlling the temperature adjustment unit based on the difference in temperature.

Fourth Embodiment of the Invention

Figure 9:
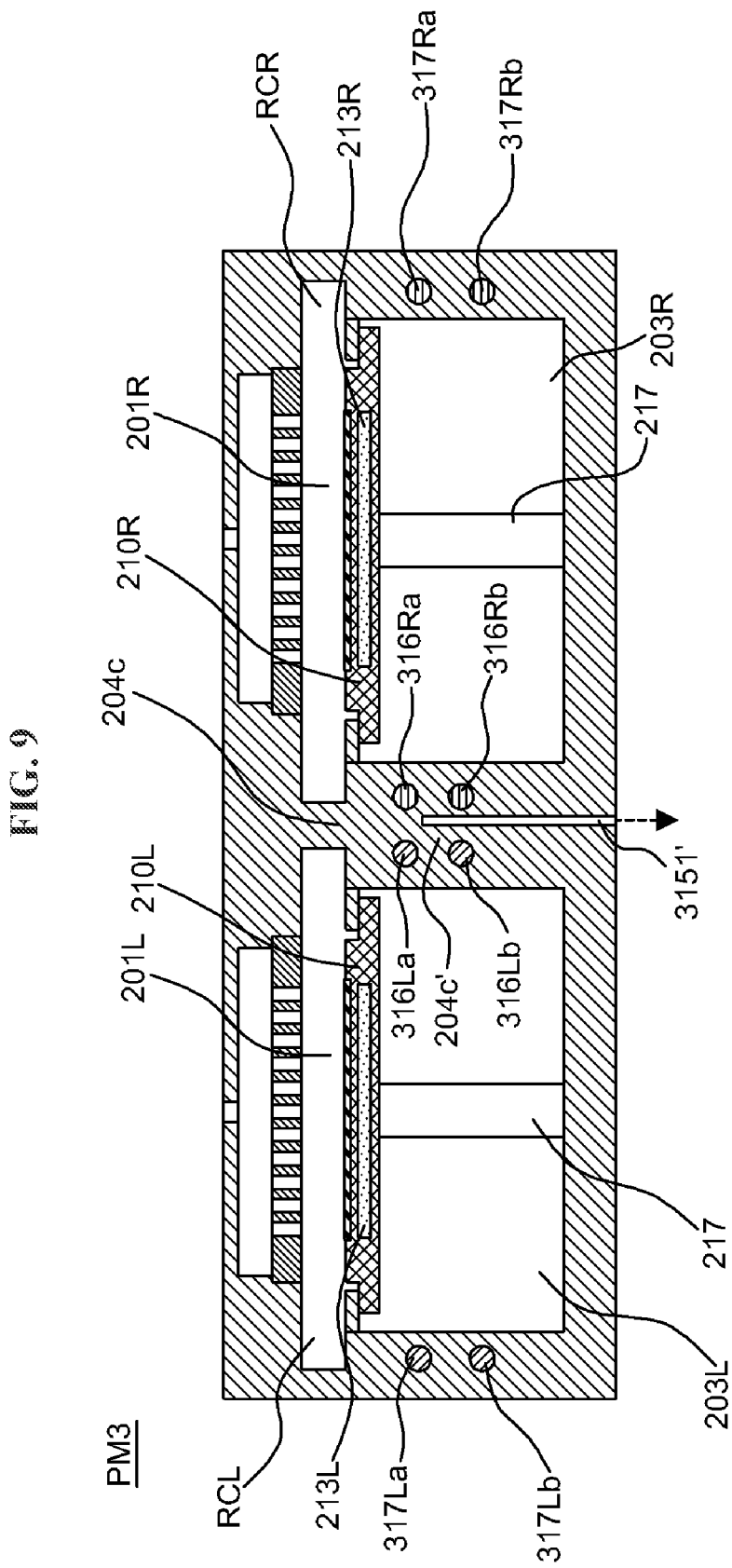
FIG. 9 is a diagram schematically illustrating a substrate processing apparatus according to a fourth embodiment of the present invention.

Next, a fourth embodiment according to the present invention will be described with reference to FIG. 9. Similar to FIG. 4A illustrating the first embodiment, FIG. 9 is a cross-sectional view taken along line A-A' of FIG. 1. The fourth embodiment is distinguished from the first embodiment in that sensors 3151' instead of the sensors 3151 are installed at the process modules according to the fourth embodiment. That is, the sensors 3151' are installed at the process modules PM1 through PM4, respectively.

A front end of the sensor 3151' is installed at each of the process modules PM1 through PM4 at a location to measure a temperature thereof. That is, the front ends of the sensors 3151' are installed between the upper penetrating pipes 316La and 316Ra and the lower penetrating pipes 316Lb and 316Rb.

As the temperature between the upper penetrating pipes 316La and 316Ra and the lower penetrating pipes 316Lb and 316Rb is detected, an average temperature can be detected by one sensor. Accordingly, the temperature can be detected at a lower cost than the second embodiment in which the two sensors are installed.

Fifth Embodiment of the Invention

Figure 10:
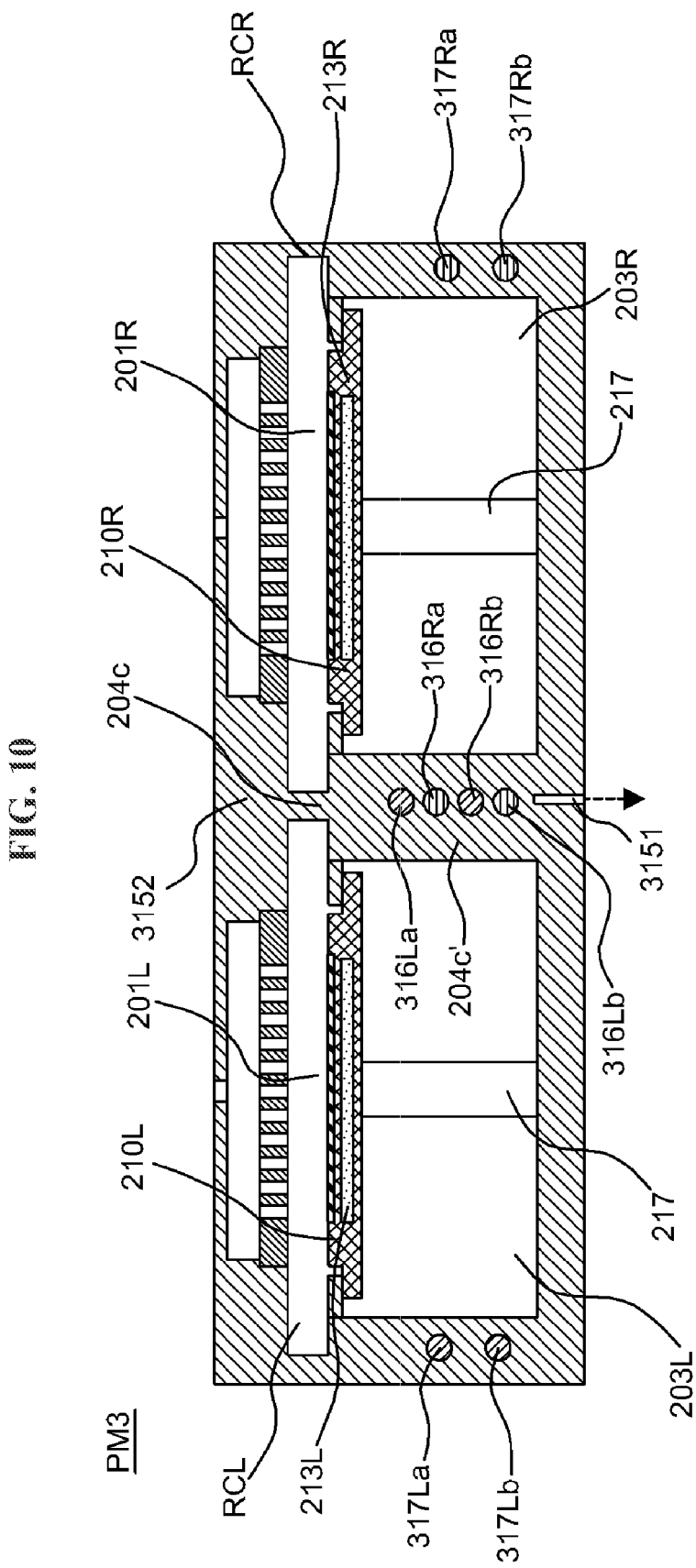
FIG. 10 is a diagram schematically illustrating a substrate processing apparatus according to a fifth embodiment of the present invention.

Next, a fifth embodiment according to the present invention will be described with reference to FIG. 10. Similar to FIG. 4A illustrating the first embodiment, FIG. 10 is a cross-sectional view taken along line A-A' of FIG. 1. The fifth embodiment is distinguished from the first embodiment in that the upper penetrating pipe 316La, the upper penetrating pipe 316Ra, the lower penetrating pipe 316Lb and the lower penetrating pipe 316Rb are vertically arranged in a line.

According to such arrangement, since a distance between the upper penetrating pipe 316La, the upper penetrating pipe 316Ra, the lower penetrating pipe 316Lb and the lower penetrating pipe 316Rb is reduced, cooling efficiency can be increased. A width in the horizontal direction of the process modules PM1 through PM4 can also be reduced.

According to the fifth embodiment, the penetrating pipes are vertically arranged in a line but not limited thereto. For example, the penetrating pipes may be provided as long as the penetrating pipes are moved and misaligned in the horizontal direction and some of the penetrating pipes overlap in the vertical direction to reduce the distance between the upper penetrating pipe 316La the upper penetrating pipe 316Ra, the lower penetrating, pipe 316Lb and the lower penetrating pipe 316Rb.

Sixth Embodiment of the Invention

Figure 11:
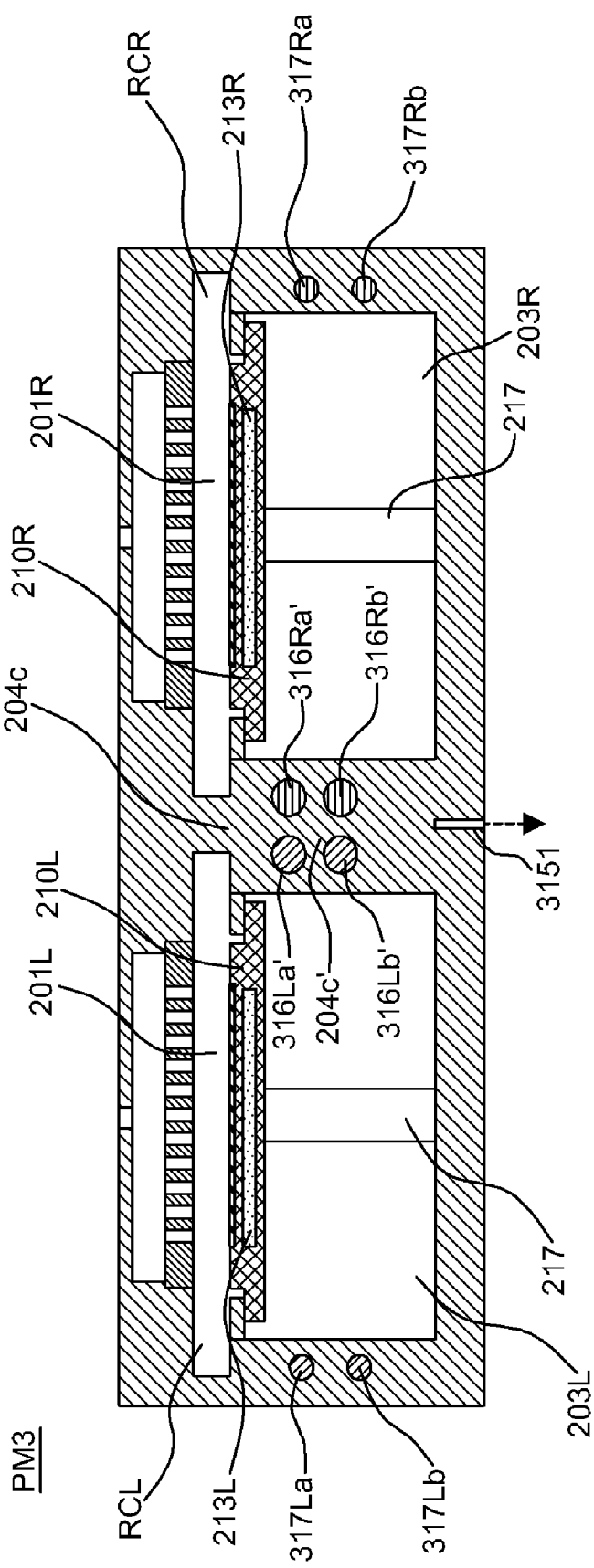
FIG. 11 is a diagram schematically illustrating a substrate processing apparatus according to a sixth embodiment of the present invention.

Next, a sixth embodiment according to the present invention will be described with reference to FIG. 11. Similar to FIG. 4A illustrating the first embodiment, FIG. 11 is a cross-sectional view taken along line A-A' of FIG. 1. The sixth embodiment is distinguished from the first embodiment in that diameters of a penetrating pipe 316La' and a penetrating pipe 316Ra' are larger than diameters of the upper peripheral pipe 317La and the upper peripheral pipe 317Ra, respectively, and diameters of the penetrating pipe 316Lb' and the penetrating pipe 316Rb' are larger than diameters of the peripheral pipe 317Lb and the peripheral pipe 317Rb, respectively. Accordingly, a surface area per unit length of the pipe in the partition wall 204c' is larger than a surface area per unit length of a pipe section of the sidewall 208 other than the partition wall.

Since the diameter of the penetrating pipe is larger than the diameter of the peripheral pipe, an amount of the thermal medium passing through the partition wall can be increased, and eventually, cooling efficiency of the partition wall can be increased.

As described above, the diameters of the penetrating pipe 316La' and the penetrating pipe 316Ra' are not limited to be larger than the diameters of the peripheral pipe 317La' and the peripheral pipe 317Ra, but may be any one of diameters as long as the desired cooling efficiency can be improved. For example, the diameter of the penetrating pipe 316La' may be larger than that of the peripheral pipe 317La and the diameter of the penetrating pipe 316Ra' may be equal to or larger than that of the peripheral pipe 317Ra.

In order to increase an area per unit area, a convex structure may be formed in a penetrating pipe 316L' or a penetrating pipe 316Ra'. The convex structure may have a structure that does not remarkably disturb a flow of the thermal medium. For example, an elongated plate having a thickness that is gradually increased from an upstream side toward a downstream side may be formed as the convex structure in the penetrating pipe 316L' or the penetrating pipe 316Ra'.

Seventh Embodiment of the Invention

Figure 12:
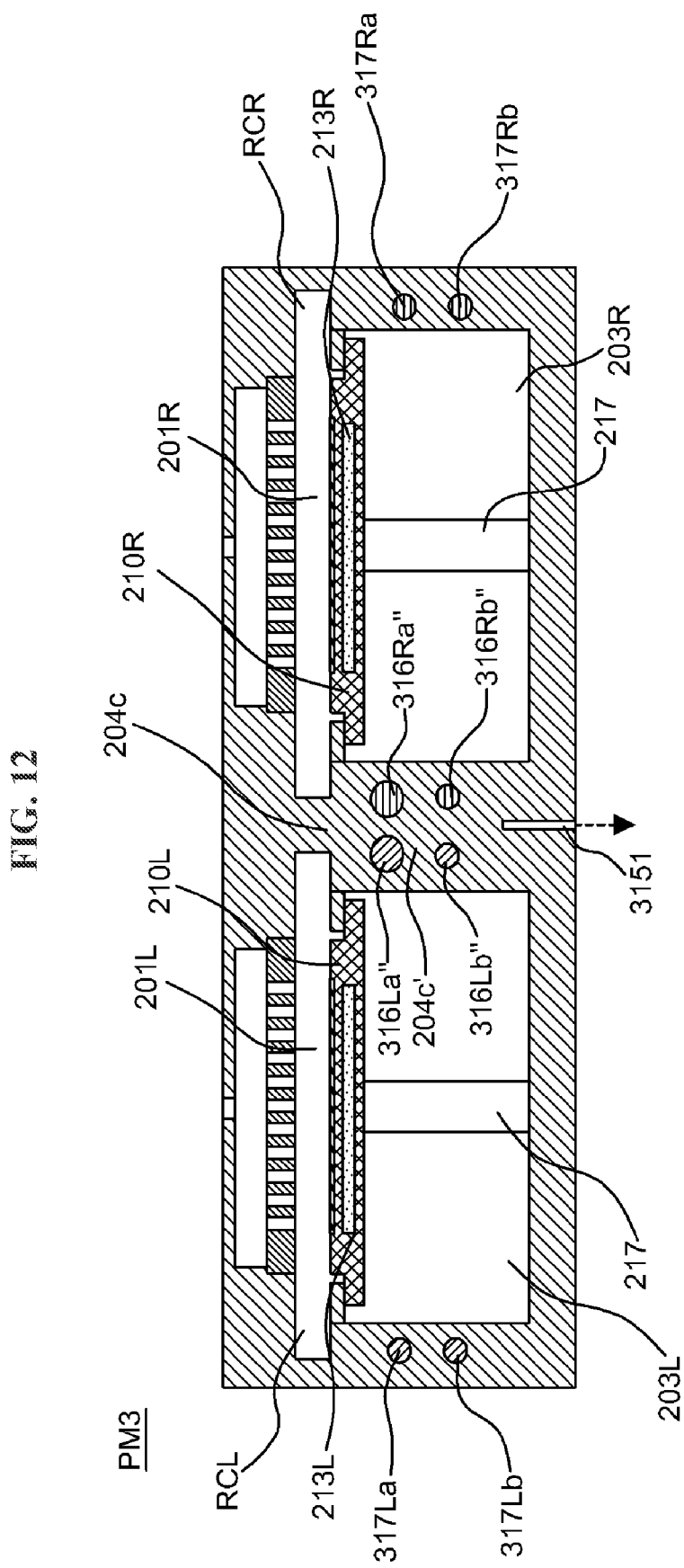
FIG. 12 is a diagram schematically illustrating a substrate processing apparatus according to a seventh embodiment of the present invention.

Next, a seventh embodiment according to the present invention will be described with reference to FIG. 12. Similar to FIG. 4A illustrating the first embodiment, FIG. 12 is a cross-sectional view taken along line A-A' of FIG. 1. The seventh embodiment is distinguished from the first embodiment in that diameters of an upper penetrating pipe 316La" and an upper penetrating pipe 316Ra" are larger than the diameters of the lower penetrating pipe 316Lb and the lower penetrating pipe 316Rb.

Since the diameter of the upper penetrating pipe is larger than that of the lower penetrating pipe, an area per unit length of the upper penetrating pipe is larger than that of the lower penetrating pipe. Accordingly, an amount of the thermal medium passing through the partition wall can be increased, and eventually, cooling efficiency of the partition wall can be increased.

As described above, the diameters of the upper penetrating pipe 316La" and the upper penetrating pipe 316Ra" are not limited to be larger than the diameters of the lower penetrating pipe 316Lb" and the lower penetrating pipe 316Rb" but may be any one of diameters as long as the desired cooling efficiency can be improved. For example, the diameter of the upper penetrating pipe 316La" may be larger than that of the lower penetrating pipe 316Lb and the diameter of the penetrating pipe 316Ra" may be equal to or larger than that of the peripheral pipe 317Ra".

Other Embodiments

Hereinabove, while the first embodiment to the seventh embodiment according to the present invention have been described in detail, the present invention is not limited to the above-mentioned embodiments but may be variously modified without departing from the spirit of the present in vend on.

According to the above-mentioned embodiments, while an example in which each of the process modules PM1 through PM4 includes two neighboring reaction chambers RCL and RCR, is described, the present invention is not limited thereto. For example, each of the process modules PM1 through PM4 according to the present invention may include three or more reaction chambers.

According to the above-mentioned embodiment, while the penetrating pipe is constituted by two layers of an upper portion and a lower portion, the present invention is not limited thereto. For example, the penetrating pipe may be one layer or three layers or more.

According to the above-mentioned embodiments, while the TiN film is formed on the wafer 200 by using the $TiCl_4$ gas serving as the first element-containing gas (the first processing gas) and the $NH_3$ gas serving as the second element-containing gas (the second processing gas) in the film-forming process performed by the substrate processing apparatus and alternately supplying the gases, the present invention is not limited thereto. That is, the processing gas used in the film-forming process is not limited to the $TiCl_4$ gas or the $NH_3$ gas but other kinds of thin films may be formed using other kind of gases. The present invention may be applied as long as three or more kinds of processing gases are supplied in turn to perform the film-forming process.

Specifically, the first element may include an element such as Si, Zr or in a addition to Ti. In addition, the second element may include an element such as O in addition to N.

According to the above-mentioned embodiments, while the film-forming process is exemplified as an example of the process performed by the substrate processing apparatus, the present invention is not limited thereto. That is, the present invention may be applied to a process of forming another thin film other than the thin film exemplified in the embodiments in addition to the film-forming process exemplified in the embodiments. In addition, regardless of the specific content of the substrate processing, in addition to the film-forming process, the present invention may be applied even when another substrate processing such as an annealing process, a diffusion process, an oxidation process, a nitridation process, a lithography process, or the like, is performed. The present invention may also be applied to another substrate processing apparatus such as an annealing processing apparatus, an etching apparatus, an oxidation processing apparatus, a nitridation processing apparatus, an exposure apparatus, an application apparatus, a drying apparatus, a heating apparatus, or a processing apparatus using plasma. The present invention may also be applied even when these apparatuses are combined. A part of the configuration of the embodiment of the present invention may be substituted with the configuration of another embodiment, and the configuration of the other embodiment may also be added to the configuration of the embodiment. Some of the configurations of the embodiments may also be added to another configuration, deleted or substituted with the other configuration.

According to the present invention, a thermal effect of a peripheral structure of a reaction chamber can be suppressed even when a substrate is processed while maintaining the reaction chamber at a high temperature.

What is claimed is:

1. A substrate processing apparatus comprising:
a first reaction chamber defined by (i) a first front portion extending in a length direction, (ii) a back wall extending in the length direction, (iii) a first sidewall extending between the first front portion and the back wall in a width direction and (iv) a second sidewall spaced from the first sidewall extending between the first front portion and the back wall in the width direction, each of the first front portion, the back wall, the first sidewall and the second sidewall also extending in a height direction between an upper portion of the first reaction chamber and a lower portion of the first reaction chamber below the upper portion of the first reaction chamber, the first reaction chamber comprising: a first heating unit configured to heat a first substrate; a first substrate support unit comprising a first substrate placing surface extending in the length direction; a first processing space where the first substrate is processed; and a first transfer space disposed under the first processing space;
a second reaction chamber, adjacent to the first reaction chamber, and defined by (i) the back wall, (ii) a second front portion extending in the length direction, (iii) the first sidewall which is shared by the first reaction chamber and the second reaction chamber and (iv) a third sidewall spaced from the first sidewall and extending in the width direction between the second front portion and the back wall, each of the back wall, the second front portion, the third sidewall and the first sidewall also extending in the height direction between an upper portion of the second reaction chamber and a lower portion of the second reaction chamber below the upper portion of the second reaction chamber, the second reaction chamber comprising: a second heating unit configured to heat a second substrate; a second substrate support unit comprising a second substrate placing surface extending in the length direction; a second processing space where the second substrate is processed; and a second transfer space disposed under the second processing space;

a first cooling channel extending spirally around the first reaction chamber in the length and width directions and extending downward from the upper portion of the first reaction chamber to the lower portion of the first reaction chamber in the height direction, wherein the first cooling channel comprises: a first inner pipe portion disposed in the first sidewall and having a first inner pipe upper section and a first inner pipe lower section spaced below the first inner pipe upper section in the height direction; a first outer pipe portion disposed in the second sidewall and having a first outer pipe upper section and a first outer pipe lower section spaced below the first outer pipe upper section in the height direction; and a plurality of first connecting pipe portions each disposed in one of the back wall and first front portion and connecting the first inner pipe portion and the first outer pipe portion such that a bottom of the upper section of the first inner pipe portion is above a bottom of the upper section of the first outer pipe portion in the height direction and a bottom of the lower section of the first inner pipe portion is above a bottom of the lower section of the first outer pipe portion in the height direction;

a second cooling channel extending spirally around the second reaction chamber in the length and width directions and extending from the upper portion of the second reaction chamber to the lower portion of the second reaction chamber in the height direction, wherein the second cooling channel comprises: a second inner pipe portion disposed in the first sidewall and having a second inner pipe upper section and a second inner pipe lower section spaced below the second inner pipe upper section in the height direction; a second outer pipe portion disposed in the third sidewall and having a second outer pipe upper section and a second outer pipe lower section spaced below the second outer pipe upper section in the height direction; and a plurality of second connecting pipe portions each disposed in one of the back wall and second front portion and connecting the second inner pipe portion and the second outer pipe portion such that a bottom of the upper section of the second inner pipe portion is above a bottom of the upper section of the second outer pipe portion in the height direction and a bottom of the lower section of the second inner pipe portion is above a bottom of the lower section of the second outer pipe portion in the height direction; and a first temperature sensor disposed between the first inner pipe portion and the second inner pipe portion in the first sidewall shared by the first reaction chamber and the second reaction chamber, wherein the first and second cooling channels are each configured to provide a flow path for a cooling medium which is received at the first inner pipe upper section of the first cooling channel and the second inner pipe upper section of the second cooling channel, respectively, and discharged at the first outer pipe lower section of the first cooling channel and the second outer pipe lower section of the second cooling channel, respectively, such that the cooling medium causes a cooling efficiency of the first sidewall to be higher than a second cooling efficiency of the second sidewall and the third sidewall.

2. The substrate processing apparatus of claim 1, wherein a surface area of the first inner pipe portion of the first cooling channel in the first sidewall per unit length is larger than an other surface area of the first outer pipe portion of the first cooling channel in the second sidewall per unit length.

3. The substrate processing apparatus of claim 1, further comprising a sealing member disposed on an outer surface of the first front portion,
wherein the bottom of the lower section of the first inner pipe portion is above the sealing member in the height direction.

4. The substrate processing apparatus of claim 1, wherein each of the upper section of the first inner pipe portion and the upper section of the second inner pipe portion is lower than at least one of a lower end of the first heating unit and a lower end of the second heating unit.

5. The substrate processing apparatus of claim 1, further comprising: a second temperature sensor disposed in the second sidewall.

6. The substrate processing apparatus of claim 1, wherein the first temperature sensor comprises: a temperature sensor portion configured to detect a temperature in a vicinity of the first inner pipe upper section of the first inner pipe portion and the second inner pipe upper section of the second inner pipe portion; and an other temperature sensor portion configured to detect an other temperature in an other vicinity of the lower section of the first inner pipe portion and the lower section of the second inner pipe portion.

* * * * *